(12) United States Patent  (10) Patent No.: US 8,519,761 B1
Kossel et al.                (45) Date of Patent:     Aug. 27, 2013

(54) CLOSED-LOOP SLEW-RATE CONTROL FOR PHASE INTERPOLATOR OPTIMIZATION

(75) Inventors: Marcel A. Kossel, Reichenburg (CH); Daihyun Lim, West New York, NJ (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/480,573

(22) Filed: May 25, 2012

(51) Int. Cl.
   *H03K 5/12* (2006.01)
(52) U.S. Cl.
   USPC ......................................................... 327/170
(58) Field of Classification Search
   USPC ......................................................... 327/170
   See application file for complete search history.

(56) References Cited

U.S. PATENT DOCUMENTS

| | | | |
|---|---|---|---|
| 6,646,483 B2 | 11/2003 | Shin | |
| 6,903,589 B2 * | 6/2005 | Kim | ............................. 327/170 |
| 7,755,413 B2 | 7/2010 | Wong | |
| 7,872,515 B1 | 1/2011 | Kuo | |
| 2003/0187599 A1 | 10/2003 | Yoo et al. | |

* cited by examiner

*Primary Examiner* — William Hernandez
(74) *Attorney, Agent, or Firm* — Keivan Razavi; H. D. Schnurmann

(57) ABSTRACT

A slew rate control circuit generates a slew-rate controlled clock signal from an input clock signal based on a feedback control mechanism. The feedback control mechanism uses the input clock signal duty cycle characteristics as a reference for controlling and maintaining an optimum slew rate for the slew-rate controlled clock signal. By using the input clock signal as a reference, the slew-rate controlled clock signal is dynamically measured and periodically adjusted over each cycle of the input clock signal.

20 Claims, 19 Drawing Sheets

CLOSED-LOOP SLEW-RATE CONTROL FOR PHASE INTERPOLATOR OPTIMIZATION

BACKGROUND

1. Field of the Invention

The present application relates generally to an improved data processing apparatus and method, and more specifically, to an apparatus and method for optimizing the phase interpolation of clock signals.

2. Background and Related Art

High-precision phase interpolators (also referred to as phase rotators) may be utilized for generation and distribution of low-jitter clock signals in modern high-speed applications, such as microprocessors and Gigabit serial communication links. Such phase interpolators may typically be employed in implementations where clock signals are not synchronized and thus misalignment and errors are possible. Also, such phase interpolators may be employed in implementations with synchronized clock signals where linear steps are required to find the optimal sample point and thus non-linear steps could cause errors or misalignment.

One example application of phase interpolators is in modern broadband communications equipment. Such broadband communications may typically be fiber optic in nature with data transmissions via these fiber optic links being serial streams of data that utilize network components such as switches, relays, bridges, etc. In order to process such data, these network components typically have a serialization/deserialization transceiver whose transmitter converts parallel data into serial data and whose receiver receives serial data and converts it back into parallel data. Because the clock signals of the transceivers of the various components are not synchronized, phase misalignment is possible and, thus, errors in the sampling of data at the receiver may be encountered.

Referring to FIG. 1A, as known in the art, a phase interpolators 100 is generally used to generate clock signal phase steps having a finer resolution for providing accurate timing control in high-speed serial links. As such, phases generated from a multi-phase PLL or delayline 102 may be further interpolated by a phase rotator 104 in order to provide additional (or finer) phase steps, which may then be used to optimize sampling timing. For example, a sampling clock may include an optimized phase when its sampling edge (e.g., clock's rising edge) is substantially aligned with the center of each bit-period associated with the data stream being sampled. Thus, in order to achieve such an alignment, providing phase tuning with sufficient granularity or resolution may be advantageous. One exemplary application for the use of such a phase rotator may be in DDR (Double Data Rate) memory links, whereby memory reads and writes are facilitated as a result of the generation of finer phases for both address and data clocks. VCO or delayline 102 may, for example, generate clock signals of the same frequency having sixteen (16) different phase steps separated by 22.5 degree increments. The phase rotator 104 may then, for example, generate additional finer phase steps by further dividing the separated 22.5 degree phase increments into an additional eight (8) phases separated by approximately 2.8125 degree increments. Thus a total of one hundred and twenty eight (128) clock phases each having a 2.8125 degree separation are generated.

Referring to FIG. 1B, as known in the art, phase rotator 104 (FIG. 1A) may typically include of phase selectors 108a, 108b, slew-rate control buffers 110a, 110b with controllable drive strength, weight control buffers 112a, 112b, and a summed output node 114. The phase selectors 108a, 108b may choose two adjacent phases (e.g., clock phases 116, 118) from the VCO or delayline 102 (FIG. 1A) outputs. The slew-rate control buffers 110a, 110b may then generate slow slew-rate signals, such as slow slew-rate signal 120, which are appropriate for phase interpolation. The weight control buffers 112a, 112b control the relative strength of the two phases (e.g., clock phases 116, 118) that are slew-rate adjusted in order to generate phase steps of a finer resolution at the summed output node 114.

For a phase rotator to generate linear phase steps with small Duty Cycle Distortion (DCD), the slew-rate control of the phase interpolator is a significant factor. Referring to FIG. 1C, the impact of signal slew-rate on phase interpolation capabilities is depicted. Excessively fast transition times into the phase interpolator may cause severe Differential Non-Linearity (DNL), where DNL may be defined as the deviation of an actual phase step from the ideal phase step (i.e., DNL of a later phase [e.g., Phase C] with respect to an earlier phase [e.g., Phase A]=[Actual Phase C−Actual Phase A]−[Ideal Phase C−Ideal Phase A]).

Referring to FIG. 1C, as known in the art, when a clock rise and fall transitions are excessively fast, the phase steps near A or B, as defined by 122, become too small and the phase steps in the middle of A and B, as defined by 124, become too large. This depicts the occurrence of a wide DNL (i.e., a wide positive for some steps and a wide negative for some steps). Therefore, an optimally controlled clock signal slew-rate at outputs 109a and 109b reduces DNL, as illustrated by the approximately uniform distribution of phase steps defined by 126. The slew-rate, however, may not be excessively slow since the slew-rate of the clock signals at outputs 109a and 109b should swing from rail-to-rail during a given clock period. Without swinging rail-to-rail, the generated slew-rate controlled clock signal at outputs 109a and 109b may exhibit significant DCD at the output, which in turn degrades clock signal timing quality.

Referring to FIG. 1D, as known in the art, an input clock waveform 128 may be slew-controlled in order generate a waveform 130 that is optimized to minimize both DNL and DCD. Thus, for each given clock frequency, the clock signal should be sufficiently slow to establish a phase overlap with an adjacent signal (i.e., DNL reduction), while still having a sufficient rise-fall time for a balanced rail-to-rail swing (i.e., DCD reduction). One challenge associated with using open-loop slew-rate control when implementing a phase rotator is that it may be difficult to achieve both satisfactory DNL and DCD over process-voltage-temperature (PVT) corners of a device. For example, an excessively slow waveform 132, not establishing a full rail-to-rail swing, may lead to an increase in DCD, while an excessively fast waveform 134 may accordingly cause an increase in DNL. At the fastest corner, the slew-rate controlled signal should be sufficiently slow to achieve good DNL. On the other hand, the signal should also swing rail-to-rail at the slowest corner to avoid severe DCD problem.

It may, therefore, be advantageous, among other things, to provide a phase rotator capable of minimizing both DNL and DCD over PVT corners based on a closed-loop slew-rate control architecture for optimizing slew-rate over various clock frequencies.

SUMMARY

According to an exemplary embodiment, a slew rate control circuit generates a slew-rate controlled clock signal from an input clock signal based on a feedback control mechanism.

The feedback control mechanism uses the input clock signal's duty cycle characteristics as a reference for controlling and maintaining an optimum slew rate for the slew-rate controlled clock signal. By using the input clock signal as a reference, the slew-rate controlled clock signal is dynamically measured and possibly adjusted over every cycle of the input clock signal.

According to another exemplary embodiment, a slew-rate control circuit for controlling slew rate of a clock signal that is input to a phase interpolator and generates a slew-rate controlled clock signal is provided. The slew rate control circuit includes a first pulse measurement circuit that is operable to receive the clock signal and generate both a first reference voltage from a first clock pulse duration associated with an on-period of the received clock signal and a second reference voltage from a second clock pulse duration associated with an off-period of the received clock signal. A second pulse measurement circuit is operable to generate a first voltage from a first pulse duration associated with a rise time of the generated slew-rate controlled clock signal, and generate a second voltage from a second pulse duration associated with a fall time of the generated slew-rate controlled clock signal. An adjustment circuit is operable to generate a first adjustment voltage and a second adjustment voltage, whereby the first adjustment voltage is operable to control the rise time of the generated slew-rate controlled clock signal based on comparing the first reference voltage and the first voltage, and the second adjustment voltage is operable to control the fall time of the generated slew-rate controlled clock signal based on comparing the second reference voltage and the second voltage.

According to another exemplary embodiment, a method of controlling slew-rate of a clock signal that is input to a slew-rate control circuit of a phase interpolator for generating a slew-rate controlled clock signal is provided. The method includes generating a first voltage from a rise time of the slew-rate controlled clock signal generated by the slew-rate control circuit, generating a second voltage from a fall time of the generated slew-rate controlled clock signal generated by the slew-rate control circuit, generating a first reference voltage from a first pulse duration associated with an on-period of the clock signal received by the slew-rate control circuit, and generating a second reference voltage from a second pulse duration associated with an off-period of the clock signal received by the slew-rate control circuit. The first reference voltage is compared with the first voltage and a first adjustment voltage is generated based on the comparing of the first reference voltage with the first voltage, such that the first adjustment voltage controls the rise time of the generated slew-rate controlled clock signal. The second reference voltage is compared with the second voltage and a second adjustment voltage is generated based on the comparing of the second reference voltage with the second voltage, such that the second adjustment voltage controls the fall time of the generated slew-rate controlled clock signal. The first and the second reference voltage are generated by and periodically updated by the slew-rate control circuit on each cycle of the clock signal.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following devices and their corresponding operational methods periodically measure and control the slew rate of clock signals that are processed within a phase interpolator in order to minimize both DNL and DCD occurrences.

Figure 1A:
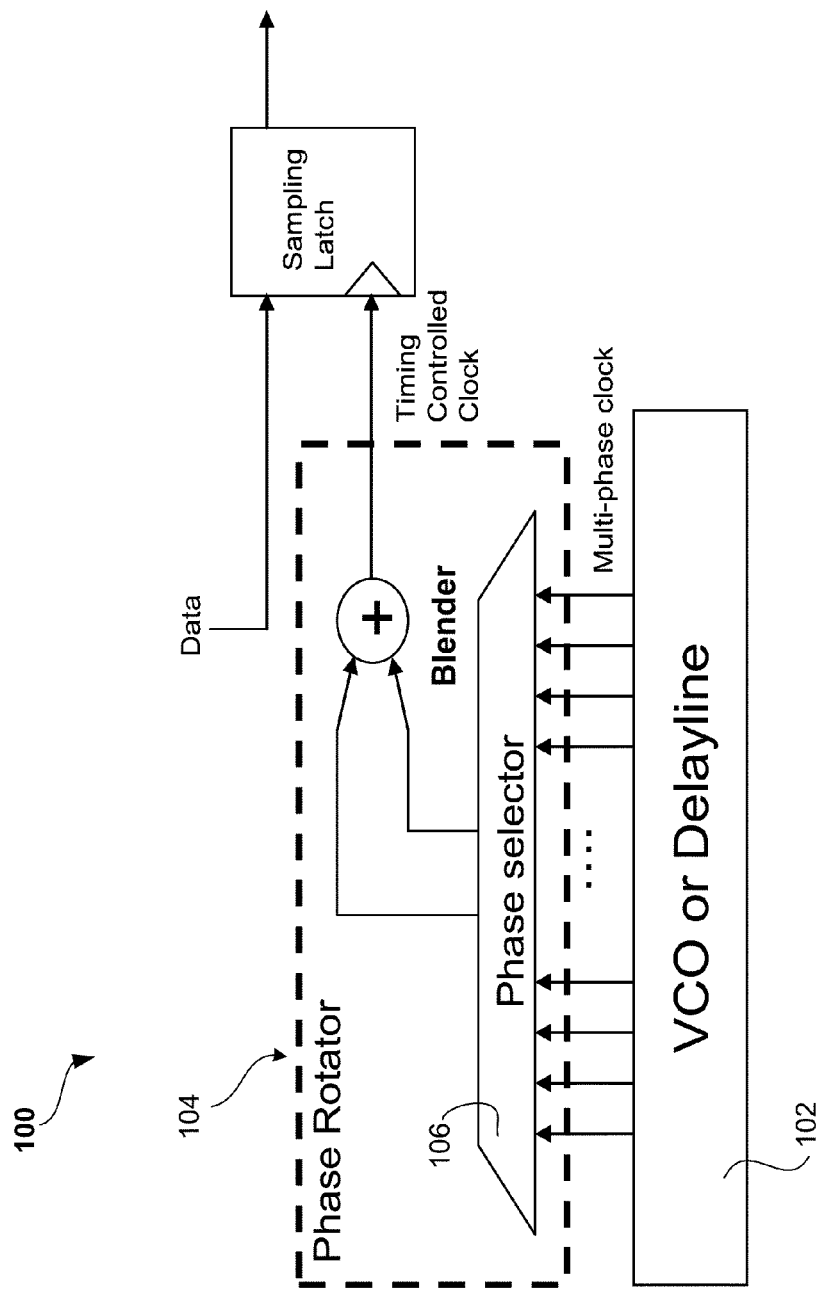
FIG. 1A illustrates an exemplary phase interpolator, as known in the art.
Figure 1B:
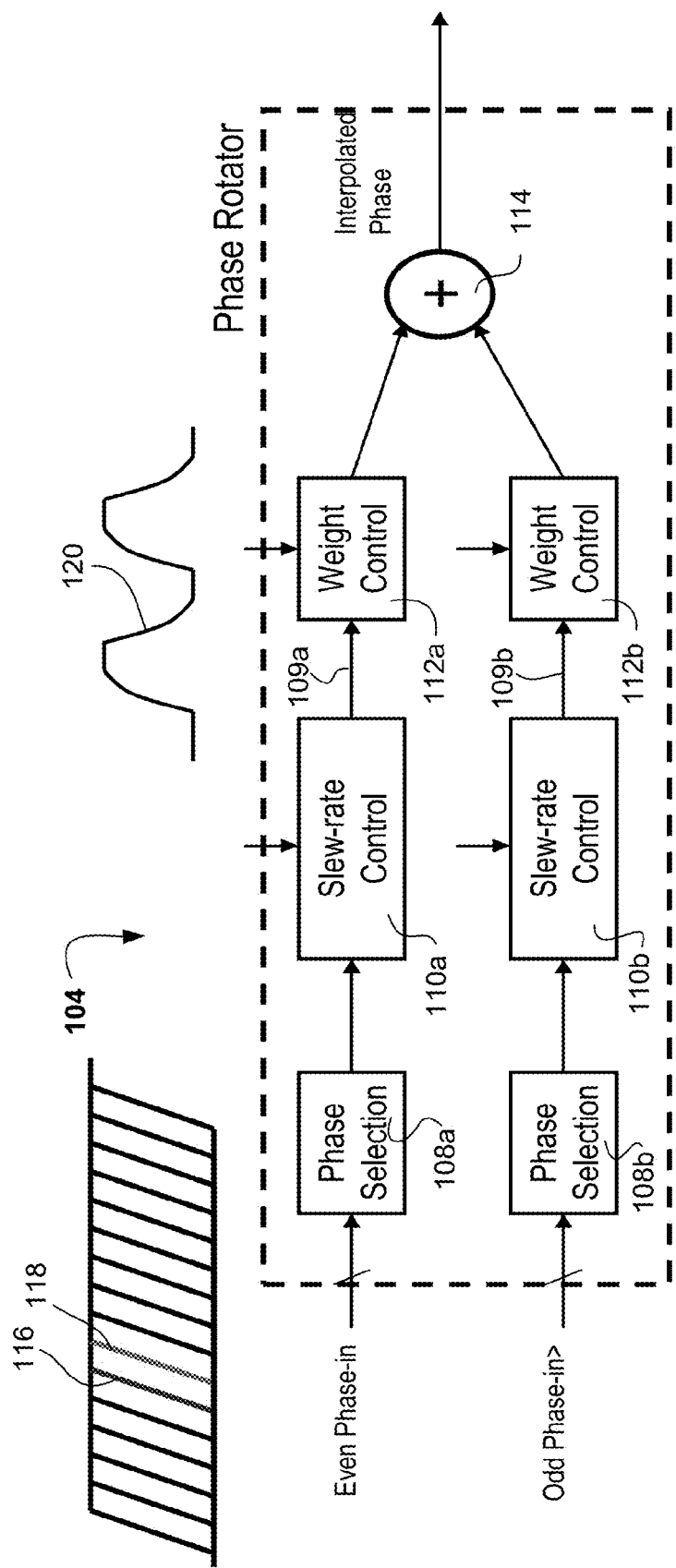
FIG. 1B is a more detailed illustration of the phase rotator shown in FIG. 1A, as known in the art.
Figure 1C:
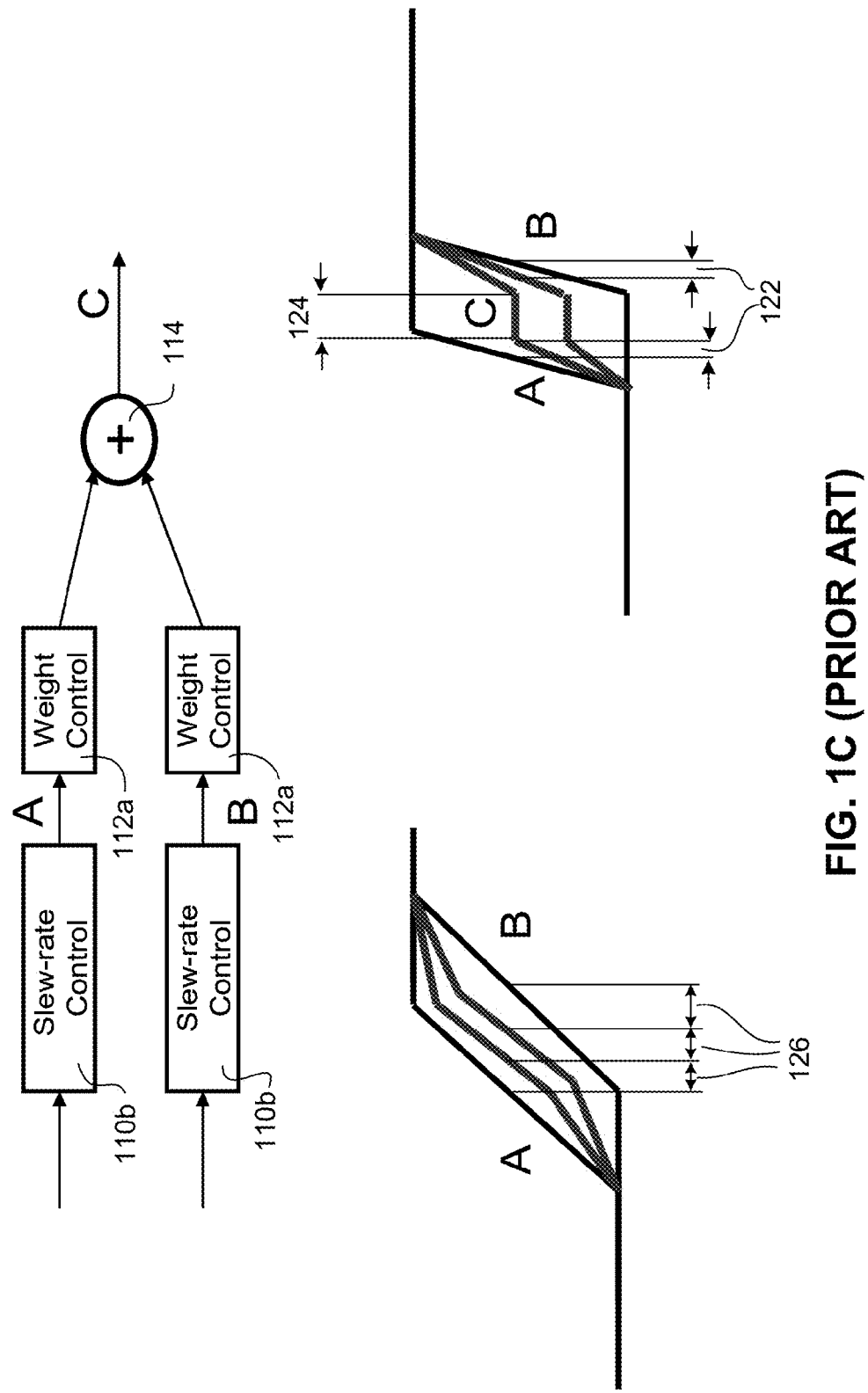
FIG. 1C illustrates phase outputs for the phase rotator of FIG. 1B based on the processing of over-lapping and non-overlapping clock signals, as known in the art.
Figure 1D:
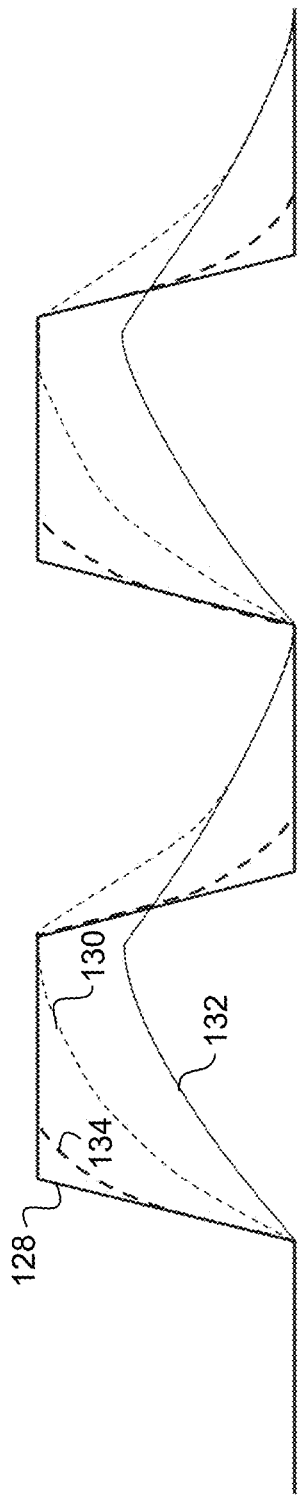
FIG. 1D illustrates different waveforms that are representative of different generated slew-rates, as known in the art.
Figure 2:
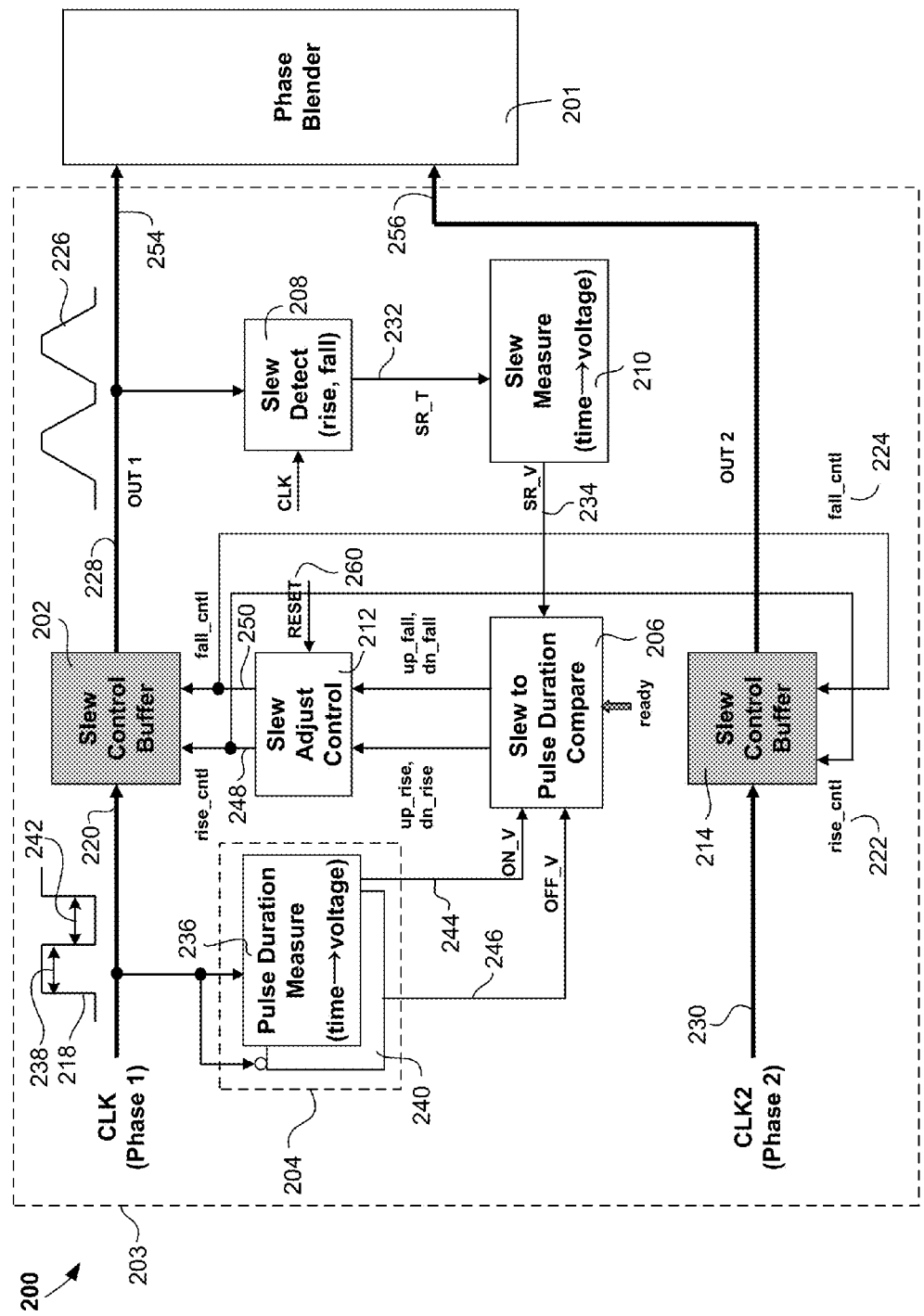
FIG. 2 is a phase interpolation circuit according to an exemplary embodiment of the invention.

FIG. 2 refers to an interpolation circuit 200 according to an exemplary embodiment. The interpolation circuit 200 includes a phase blender 201 and a slew-rate control circuit 203. The slew-rate control circuit may include a slew control buffer 202 associated with a first (i.e., reference) clock signal, a pulse duration measurement circuit 204, a slew to pulse duration comparison circuit 206, a slew-rate detection circuit 208, a slew-rate measurement circuit 210, a slew-rate adjustment control circuit 212, and a slew control buffer circuit 214 associated with a second clock signal.

In the above circuit, the phase blender 201 receives slew-controlled clock signals at inputs 254 and 256, and generates clock signals of different phases. For example, if the input clock signals received at inputs 220 and 230 of the slew-rate control circuit 203 are separated by a phase difference of 22.5 degrees, the phase blender 201 may generate a series of clock signals of smaller phase increments (e.g., 2.8 degrees) between the phases of these two inputted clocks.

The slew control buffer 202 controls the rise and fall times (i.e., slew rate) of an incoming clock signal 218 on input 220 using DC adjustment voltages provided by rise_cntl and fall_cntl control signals. For example, the rise and fall times (i.e., slew) of clock signal 218 may be manipulated to generate slew-controlled output clock signal 226 at the output 228 of the slew control buffer 202. Similarly, slew-rate control circuit 214 also controls the rise and fall times (i.e., slew rate) of another incoming clock signal on input 230 using the same DC adjustment voltages provided by the rise_cntl and fall_cntl control signals. The clock signal on input 220 has a first phase (i.e., Phase 1), while the clock signal on input 230 has a second phase (i.e., Phase 2). The clock signals on both inputs 220 and 230 do, however, have the same frequency and duty cycle. In operation, for example, the phase blender 201 may generate several (e.g., 8) additional clock phases between the phase (i.e., Phase 1) of the clock signal on input 220 and the phase (i.e., Phase 2) of the clock signal on input 230. A more detailed description of the slew control buffer 202 is provided in the following paragraphs with reference to FIG. 4. In other embodiments, there could be multiple slew control buffers that receive other phases of the input clock CLK (i.e., other than Phase 1 and Phase 2). These buffers may also be controlled by the same rise_cntl signal 248 and fall_cntl signal 250, provided that the input duty cycle of the other phases are similar to that of Phases 1 and 2 of the CLK and CLK2 signals (FIG. 2), respectively. Thus, only one closed loop generates the rise_cntl signal 248 and the fall_cntl signal 250 based on one input phase (e.g., Phase 1), whereby the rise_cntl and fall_cntl control signals 248, 250 are shared by the other slew control buffers.

The slew-rate detection circuit 208 detects the rise and fall times (i.e., slew) of the slew-controlled output clock signal 226 at output 228. The slew-rate detection circuit 208 provides output feedback by generating a pulse signal for each rise time and fall time of the slew-controlled output clock signal 226. For example, as the rise time of the rising edge of the slew-controlled output clock signal 226 increases (i.e., slower transition), the pulse width generated by the slew-rate detection circuit 208 also increases such that the pulse width equals the rise time. Inversely, as the rise time of the rising edge of the slew-controlled output clock signal 226 decreases (i.e., faster transition), the pulse width generated by the slew-rate detection circuit 208 also decreases. Similarly, for example, as the fall time of the rising edge of the slew-controlled output clock signal 226 increases, the pulse width generated by the slew-rate detection circuit 208 also increases such that the pulse width equals the fall time. Inversely, as the fall time of the falling edge of the slew-controlled output clock signal 226 decreases; the pulse width generated by the slew-rate detection circuit 208 also decreases. The pulses generated at the output 232 of the slew-rate detection circuit 208 are denoted by SR_T. A more detailed description of slew-rate detection circuit 208 is provided in the following paragraphs with reference to FIGS. 5 and 6.

The slew-rate measurement circuit 210 receives the SR_T pulses from the slew-rate detection circuit 208 and generates a DC voltage based on these SR_T pulses. For example, as the SR_T pulses increase in pulse width (i.e., slower rise/fall times), the generated DC voltage value also increases. Conversely, as the SR_T pulses decrease in pulse width (i.e., faster rise/fall times), the generated DC voltage value also decreases. In effect, the slew-rate measurement circuit 210 integrates the received pulses such that the output 234 of the pulse duration measurement circuit 210 ramps up to a DC voltage value for each received SR_T pulse. The DC voltages generated at the output 234 of the pulse duration measurement circuit 210 are denoted by SR_V. A more detailed description of slew-rate measurement circuit 210 is provided in the following paragraphs with reference to FIGS. 7 and 8.

The pulse duration measurement circuit 204 receives the input clock signal 218 on input 220. In the illustrated embodiment, clock signal 218 is used as a reference clock in the slew rate adjustment of both clocks present at inputs 220 and 230. Pulse duration measurement circuit 204 includes a first pulse measurement circuit 236 for converting the ON period 238 of the clock 218 to a DC voltage value denoted by ON_V. Pulse duration measurement circuit 204 also includes a second pulse measurement circuit 240 for converting the OFF period 242 of the clock 218 to a DC voltage value denoted by OFF_V. The ON_V signal is used in the control (i.e., reduction or increase) of the rise time of the clock 218, while the OFF_V signal is used in the control (i.e., reduction or increase) of the fall time of the clock 218. In effect, the first pulse duration measurement circuit 236 integrates the received clock pulses such that the output 244 of the first pulse duration measurement circuit 236 ramps up to a DC voltage value (i.e., ON_V) for each ON period 238 of the clock 218. The second pulse measurement circuit 240 also integrates the received clock pulses such that the output 246 of the second pulse measurement circuit 240 ramps up to a DC voltage value (i.e., OFF_V) for each OFF period 238 of the clock 218. In order to generate the ramp signal for the OFF period 242 of the clock 218, the clock 218 is inverted so that the OFF period is represented by a positive pulse that may subsequently be integrated. Essentially, the first and the second pulse duration measurement circuits 236, 240 may be identical, whereby the clock signal 218 input to the second pulse measurement circuit 240 is inverted. A more detailed description of pulse duration measurement circuit 204 is provided in the following paragraphs with reference to FIGS. 9 and 10.

The slew-rate to pulse duration comparison circuit 206 uses the OFF_V and ON_V signals as reference values that are created on each cycle period of the clock 218. At the slew-rate to pulse duration comparison circuit 206, the OFF_V and ON_V reference values are compared with the SR_V value that is calculated based on the rise/fall times associated with the slew-controlled clock signal 226 generated at output 228. Based on this comparison, each of the rise times and the fall times of the slew-controlled clock signal 226 may be independently controlled. For example, the rise time may be controlled by signals up_rise and dn_rise, where the up_rise signal generates a longer rise time (i.e., slower transition) and the dn_rise signal generates a shorter rise time (i.e., faster transition). Similarly, the fall time may be controlled by signals up_fall and dn_fall, where the dn_fall signal generates a longer fall time (i.e., slower transition) and the up_fall signal generates a shorter fall time (i.e., faster transition). A more detailed description of pulse duration measurement circuit 204 is provided in the following paragraphs with reference to FIGS. 11 and 12.

The slew-rate adjustment control circuit 212 receives the up_rise, dn_rise, up_fall, and dn_fall control signals, which are single generated pulses. The slew-rate adjustment control circuit 212 then integrates these pulses to generate both a rise_cntl and fall_cntl signal for use by the control circuits 202, 214. The up_rise control signal is integrated to generate a rise_cntl signal that may provide an incremental increase in DC voltage at output 248 of the slew-rate adjustment control circuit 212. Thus, the rise_cntl signal may generate a longer rise time (i.e., slower transition) for the slew-controlled clock signal 226 generated by the slew control buffer circuit 202. Conversely, the dn_rise control signal is integrated to generate a rise_cntl signal that may provide an incremental decrease in DC voltage at output 248 of the slew-rate adjustment control circuit 212. Thus, the rise_cntl signal may generate a shorter rise time (i.e., faster transition) for the slew-controlled clock signal 226 generated by the slew control buffer circuit 202.

Similarly, the dn_fall control signal is integrated to generate a fall_cntl signal that may provide an incremental decrease in DC voltage at output 250 of the slew-rate adjustment control circuit 212. Thus, the fall_cntl signal may generate a longer fall time (i.e., slower transition) for the slew-controlled clock signal 226 generated by the slew control buffer circuit 202. Conversely, the up_fall control signal is integrated to generate a fall_cntl signal that may provide an incremental increase in DC voltage at output 250 of the slew-rate adjustment control circuit 212. Thus, the fall_cntl signal may generate a shorter fall time (i.e., faster transition) for the slew-controlled clock signal 226 generated by the slew control buffer circuit 202. A more detailed description of slew-rate adjustment control circuit 212 is provided in the following paragraphs with reference to FIGS. 13 and 14.

Thus, using feedback generated control signals SR_T, SR_V, ON_V, OFF_V, up_rise, dn_rise, up_fall, dn_fall, rise_cntl, and fall_cntl; the slew control buffer circuit 202 provides optimally rise/fall time controlled (i.e., slew rate controlled) clock signals to inputs 254 and 256 of the phase blender 201.

Figure 3:
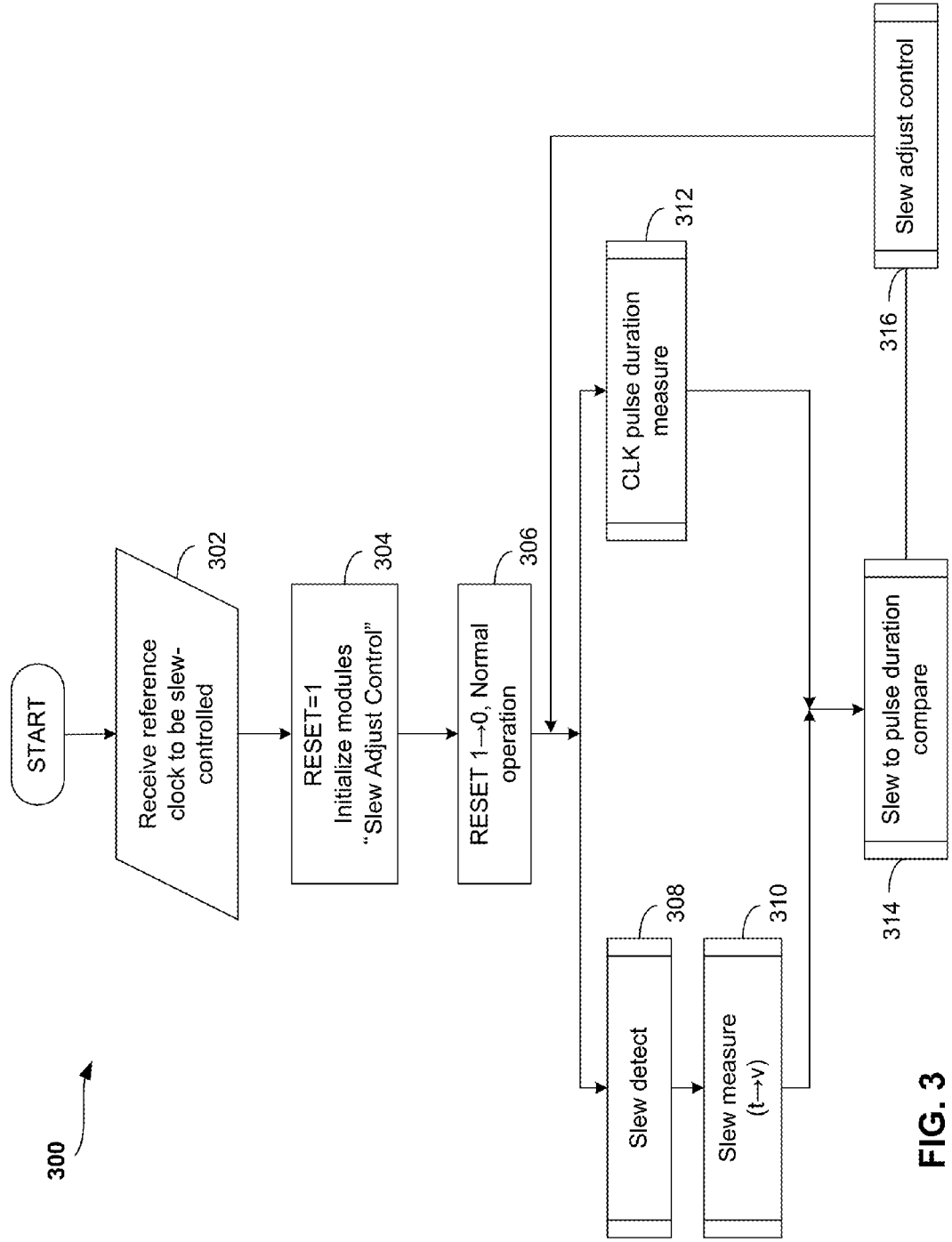
FIG. 3 illustrates an operational flow diagram for the phase interpolation circuit of FIG. 2.

FIG. 3 is an operational flow diagram 300 of the exemplary circuit 200 embodiment described in FIG. 2. In the following paragraphs, FIG. 3 is described with the aid of FIG. 2. At 302, clock signal 218 is received and designated as a reference clock for providing slew rate control. At 304, a logic '1' RESET control signal 260 is applied to the slew-rate adjustment control circuit 212 in order to set the rise_cntl and fall_cntl signals to default DC values. The generated default DC values can be set to provide valid rail-to-rail transition times (such as a fast transition times) for both the rise and fall times of the input clock signal 218. At 306, a logic '0' RESET control signal 260 is applied to the slew-rate adjustment control circuit 212 in order for the circuit 200 to resume normal operation by responding to these default DC values through the feedback mechanism in order to generate optimized DC values. The optimized DC values are generated by re-adjusting the rise_cntl and fall_cntl signals, and thus, re-adjusting the rise and fall times of input clock signal 218. The feedback operations are defined in the following steps.

At 308, the slew-rate detection circuit 208 detects the rise and fall times (i.e., slew rate) of the slew-controlled output clock signal 226 at output 228. The slew-controlled output clock signal 226 is a slew-controlled version of the reference clock 218 that is received at the input of the slew control buffer circuit 202. The slew-rate detection circuit 208 provides output feedback by generating a pulse signal for each rise time and fall time of the slew-controlled output clock signal 226, where the width of the pulse signal is equivalent to the rise and fall time of slew-controlled output clock signal 226.

At 310, the slew-rate measurement circuit 210 converts the pulse signals (i.e., SR_T) received form the slew-rate detection circuit 208 into DC voltages (i.e., SR_V). At 312, the pulse duration measurement circuit 204 generates DC voltages (i.e., ON_V, OFF_V) from the input reference clock 218, whereby the DC voltages function as reference DC voltages that are refreshed on every cycle of clock signal 218.

At 314, the slew to pulse duration comparison circuit 206 receives and compares the DC voltages (SR_V) output from the slew-rate measurement circuit 210 with the reference DC voltages (ON_V, OFF_V) output from the pulse duration measurement circuit 204. Based on this comparison, the pulse duration comparison circuit 206 generates the dn_rise, up_rise, up_fall, and dn_fall control signals for optimally controlling the transition times (i.e., rise and fall times) of the clock input 218 in order to generate the slew-controlled output clock 226.

The optimal controlling of the transition times may involve slowing the transition times (i.e., rise and fall times) of the clock input 218 to the extent that DNL is minimized, while also making sure that the transition times (i.e., rise and fall times) are fast enough to provide a rail-to-rail (e.g., $V_{supply} \rightarrow V_{ground}$, $V_{ground} \rightarrow V_{supply}$) voltage transition for reducing DCD.

At 316, the slew-rate adjustment control circuit 212 receives the up_rise, dn_rise, up_fall, and dn_fall control pulses and adjusts the slew-rate of the clock input 218 via control circuit 202 in order to generate slew-controlled output clock 226. Based on receiving the up_rise signal, the slew-rate adjustment control circuit 212 generates a longer rise time for the slew-controlled output clock 226 by applying a DC voltage increase to control circuit 202 using the rise_cntl signal. Based on receiving the dn_rise signal, the slew-rate adjustment control circuit 212 generates a shorter rise time for the slew-controlled output clock 226 by reducing the DC voltage to control circuit 202 using the rise_cntl signal. Based on receiving the dn_fall signal, the slew-rate adjustment control circuit 212 generates a longer fall time for the slew-controlled output clock 226 by applying a DC voltage decrease to control circuit 202 using the fall_cntl signal. Also, based on receiving the up_fall signal, the slew-rate adjustment control circuit 212 generates a shorter fall time for the slew-controlled output clock 226 by increasing the applied DC voltage to control circuit 202 via the fall_cntl signal.

Processes 308-316 repeat for each cycle of the reference clock input 218, and enable a periodic slew-rate control that accounts and responds to any variations in the reference clock input 218 by accordingly varying the generated control reference signals (i.e., ON_V, OFF_V).

Figure 4:
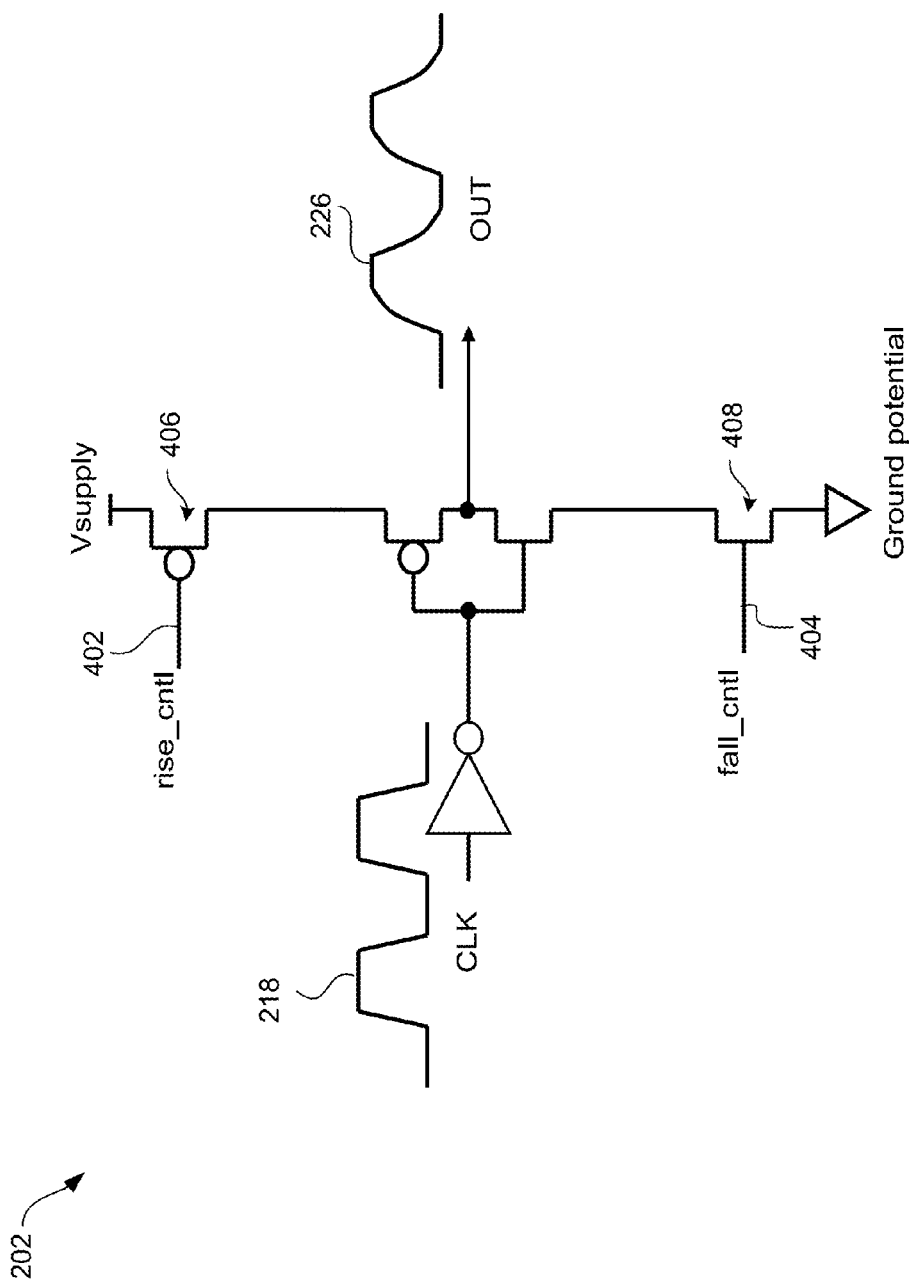
FIG. 4 is an exemplary embodiment of a control circuit shown in FIG. 2

FIG. 4 refers to one exemplary embodiment of the slew control buffer circuit 202 shown in FIG. 2. The slew control buffer circuit 202 may include a current controlled inverter circuit that is configured to independently control the rise times and the fall time of the input clock signal 218 by means of input control signals rise_cntl and fall_cntl received at inputs 402 and 404, respectively.

For example, when the rise_cntl signal includes an increased DC adjustment voltage, current flowing through pFET device 406 decreases and subsequently slows down the rise time of the slew-controlled output clock signal 226. Conversely, when the rise_cntl signal includes a decreased DC adjustment voltage, current flowing through pFET device 406 increases and subsequently generates a faster rise time for the slew-controlled output clock signal 226.

For example, when the fall_cntl signal includes an increased DC adjustment voltage, current flowing through nFET device 408 increases and subsequently generates a faster fall time for the slew-controlled output clock signal 226. Conversely, when the fall_cntl signal includes a decreased DC adjustment voltage, current flowing through nFET device 406 decreases and subsequently slows down the fall time of the slew-controlled output clock signal 226.

Figure 5:
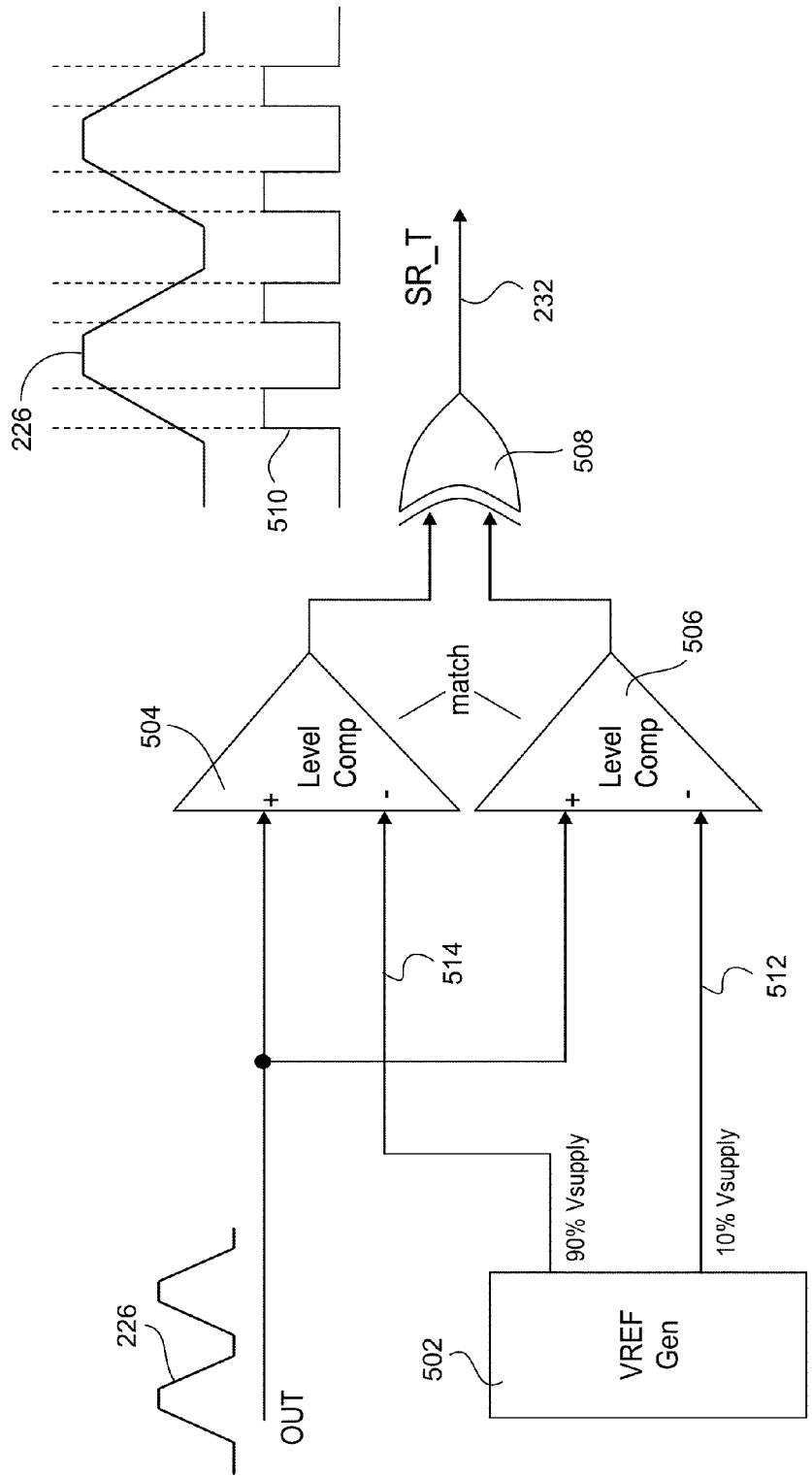
FIG. 5 is an exemplary embodiment of a slew-rate detection circuit shown in FIG. 2.

FIG. 5 refers to one exemplary embodiment of the slew-rate detection circuit 208 shown in FIG. 2. The slew-rate detection circuit 208 may include a voltage reference device 502, a first level comparator 504, a second level comparator 506, and an XOR logic gate 508. In operation, the slew-rate detection circuit 208 converts the rise times (i.e., measured from 10%→90% of clock amplitude) and the fall times (i.e., measured from 90%→10% of clock amplitude) of slew-controlled output clock signal 226 to a series of pulses 510 at output 232. Thus, control signal SR_T at output 232 generates a series of pulses 510 that have pulse widths that vary in proportion to changes in the rise and fall times of the slew-controlled output clock signal 226.

Figure 6:
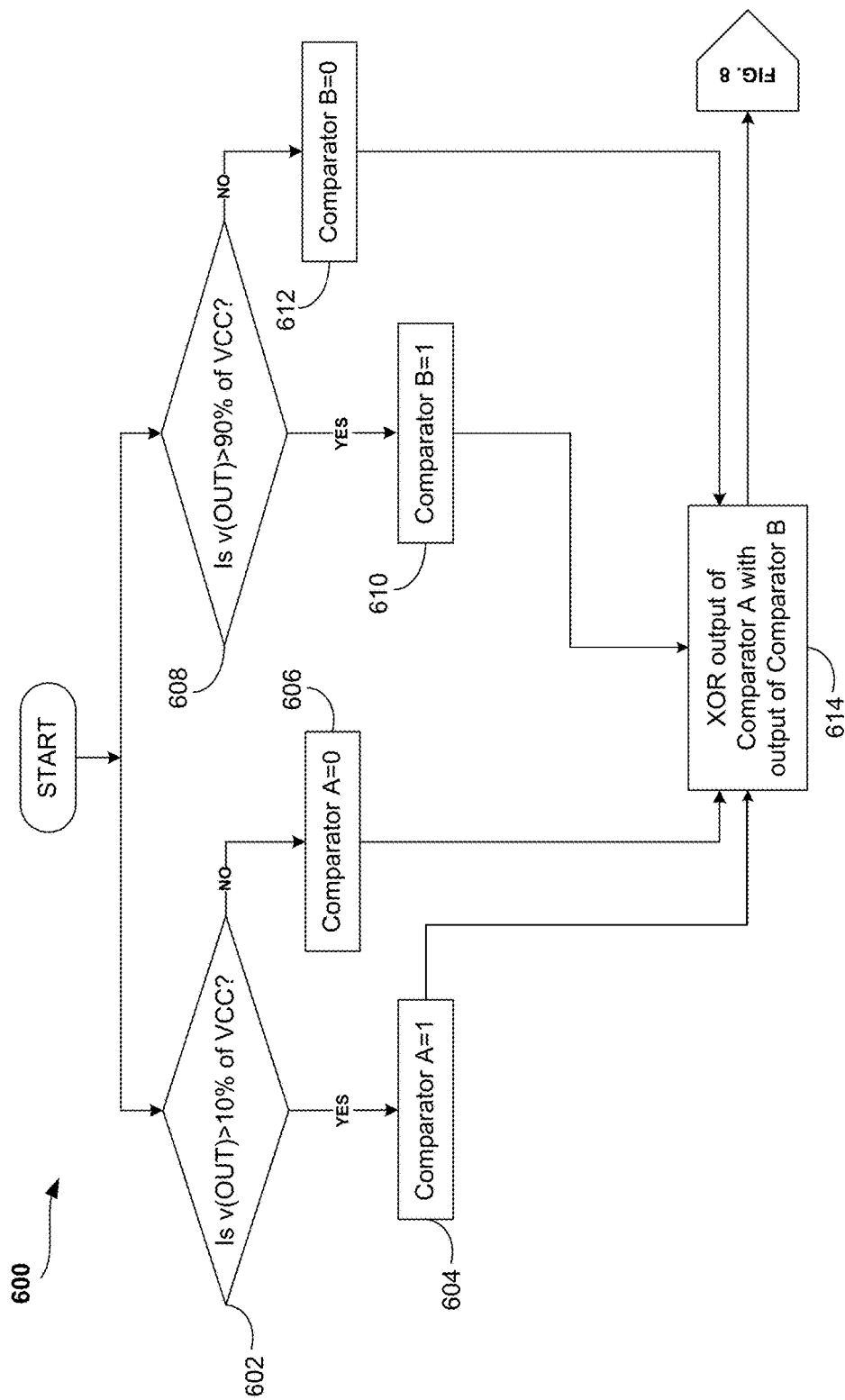
FIG. 6 illustrates an operational flow diagram for the slew-rate detection circuit of FIG. 5.

FIG. 6 is an operational flow diagram 600 for the slew-rate detection circuit 208 shown in FIG. 5. The operation of the slew-rate detection circuit 208 will be described with the aid of FIGS. 5 and 6. Referring to FIG. 6, at 602, it is determined whether the amplitude of the slew-controlled output clock signal 226 is greater than 10% of its maximum output voltage (i.e., $V_{supply}$). This determination is achieved using voltage reference 512 (i.e., $V_{refl}=0.1*V_{supply}$), which is provided by the voltage reference device 502, and comparator 506, which compares voltage reference 512 with the slew-controlled output clock signal 226.

At 604, when the amplitude of the slew-controlled output clock signal 226 is greater than the voltage reference 512, the comparator 506 generates a logic '1' output. Alternatively, when the amplitude of the slew-controlled output clock signal 226 is less than the voltage reference 512, the comparator 506 generates a logic '0' output, as defined at 606.

At 608, it is determined whether the amplitude of the slew-controlled output clock signal 226 is greater than 90% of its maximum output voltage (i.e., $V_{supply}$). This determination is achieved using voltage reference 514 (i.e., $V_{refh}=0.9*V_{supply}$), which is provided by the voltage reference device 502, and comparator 504, which compares voltage reference 514 with the slew-controlled output clock signal 226.

At 610, when the amplitude of the slew-controlled output clock signal 226 is greater than the voltage reference 514, the comparator 504 generates a logic '1' output. Alternatively, when the amplitude of the slew-controlled output clock signal 226 is less than the voltage reference 514, the comparator 504 generates a logic '0' output, as defined at 612.

At 614, the XOR logic gate 508 performs an XOR logic operation on the received logic outputs from the comparators 504, 506. As shown by waveform 510 (FIG. 5), the XOR output generates a pulse when the amplitude of the slew-controlled output clock signal 226 rises from 10% of its amplitude to 90% of its amplitude and falls from 90% of its amplitude to 10% of its amplitude. Thus, pulses for both the rise time and fall time of the slew-controlled output clock signal 226 are generated. Particularly, the width of the generated pulses depend on the rise and fall times, whereby, for example, when the rise or fall times increase (i.e., slower transitions), the generated pulse widths accordingly increase, and when the rise or fall times decrease (i.e., faster transitions), the generated pulse widths accordingly decrease.

Figure 7:
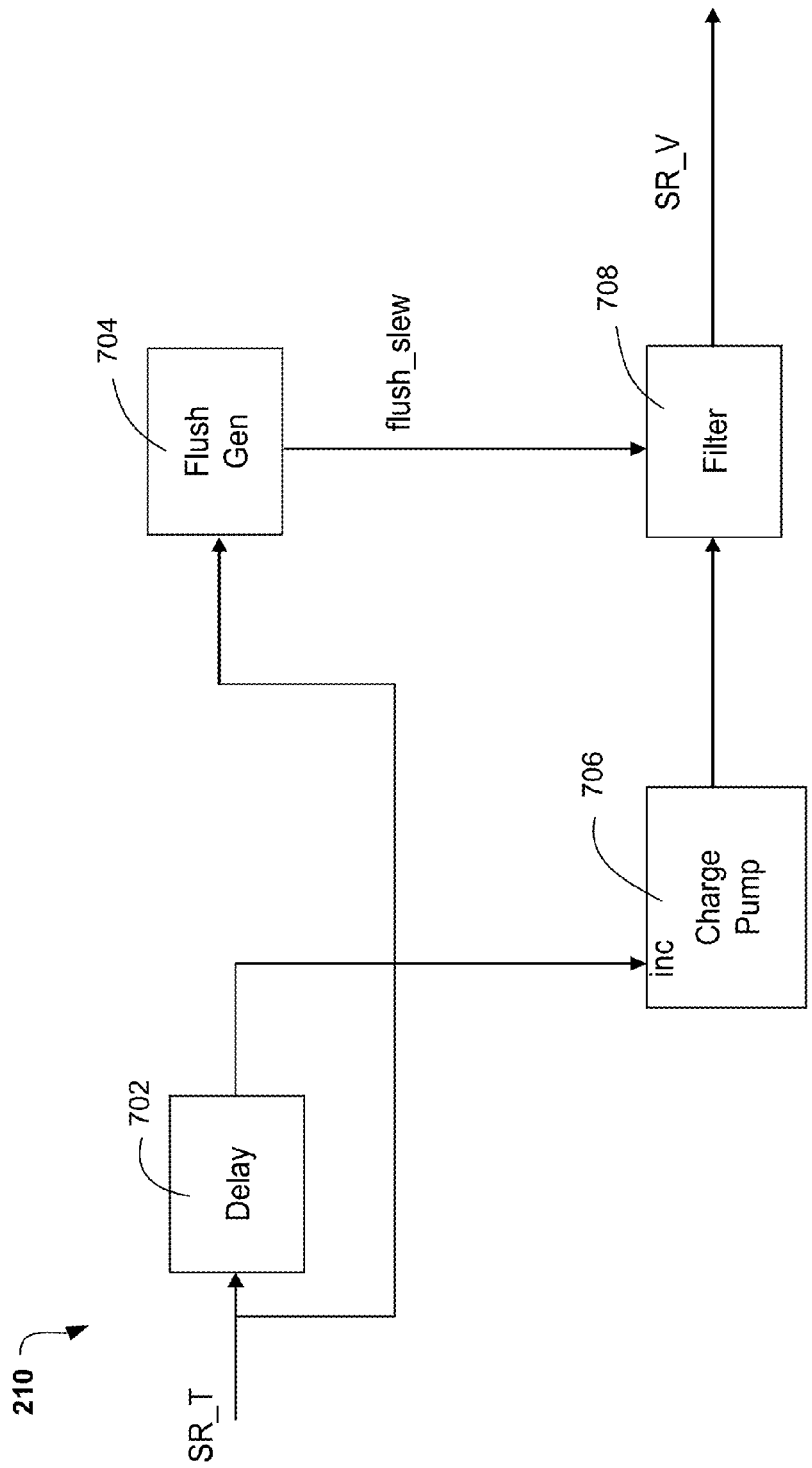
FIG. 7 is an exemplary embodiment of a slew-rate measurement circuit shown in FIG. 2.

FIG. 7 refers to one exemplary embodiment of the slew-rate measurement circuit 210 shown in FIG. 2. The slew-rate measurement circuit 210 may include a delay device 702, a flush generation device 704, a charge pump device 706, and a filter device 708. In operation, the slew-rate measurement circuit 210 receives the SR_T pulse train from output 232 (FIG. 5) of the slew-rate detection circuit 208 (FIG. 5), and generates DC control voltage SR_V based on the pulse widths of the received SR_T pulse train.

The charge pump device 706 and filter device 708 (e.g., a capacitor) operate as an integrator device. As such, any pulse signal (i.e., SR_T) received by the charge pump device 706 and filter device 708 combination, is integrated to generate a signal that ramps up to a certain DC voltage level based on the width of the received pulse. Since the slew-rate measurement circuit 210 generates a DC voltage (SR_V) for each pulse width of the received SR_T pulse train, the integration operation should be reset for each pulse width. This reset operation is provided by the delay device 702 and the flush generation device 704. When a received pulse is integrated, the filter device 708 may hold the generated DC voltage (SR_V) using a capacitor device (not shown). Prior to integrating the next received pulse, however, the capacitor should be discharged in preparation for the next integration operation. Thus, any generated DC voltage (SR_V) held by the filter 708 is reset to zero volts by a pulse generated by the flush generation circuit 704. The flush generation circuit 704 is activated by the rising edge transition of each of the received SR_T pulses. The delay device 702 ensures that the pulse that is received by the charge pump device 706 and filter device 708 is delayed by enough time duration in order to allow the filter to be reset to 0V prior to integrating the received pulse.

Figure 8:
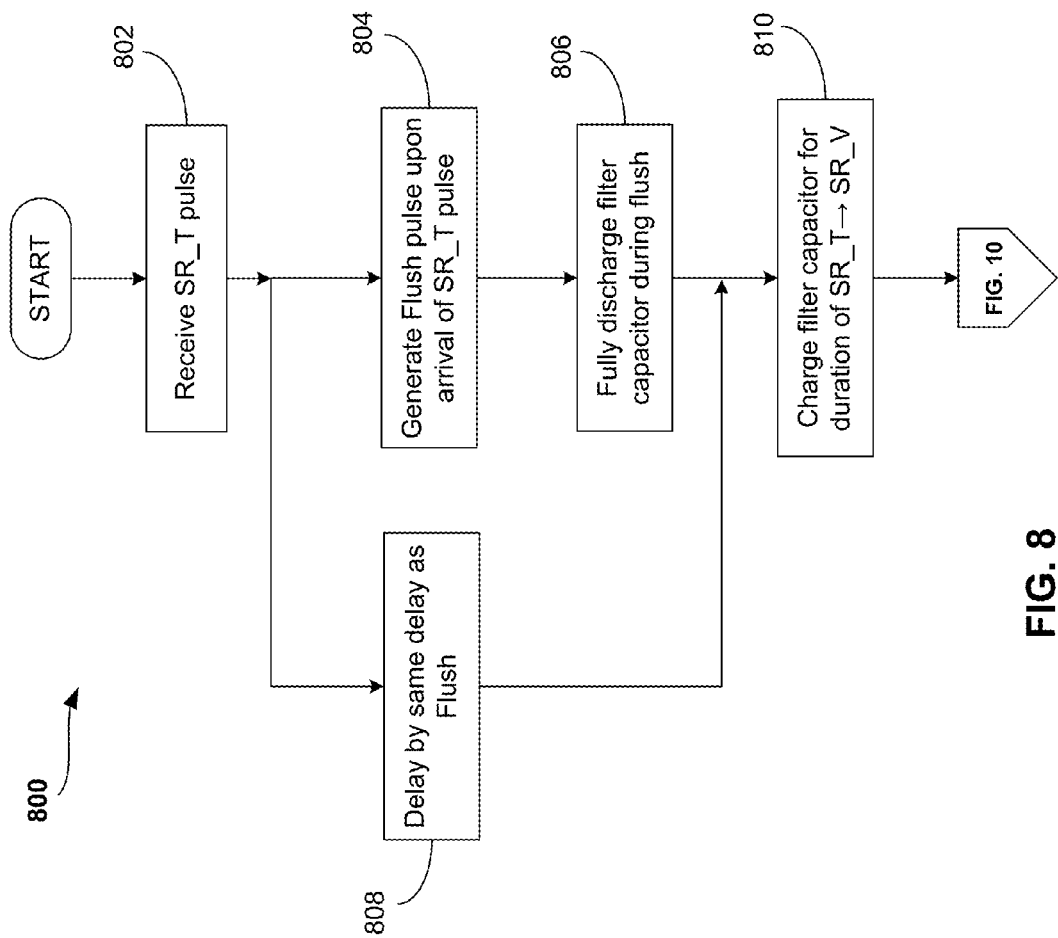
FIG. 8 illustrates an operational flow diagram for the slew-rate measurement circuit of FIG. 7.

FIG. 8 is an operational flow diagram 800 for the slew-rate measurement circuit 210 shown in FIG. 7. The operation of the slew-rate measurement circuit 210 will be described with the aid of FIGS. 7 and 8. Referring to FIG. 8, at 802, an SR_T pulse is received. At 804, using the rising transition of the SR_T pulse, the flush generation device 704 generates a flush or reset pulse. At 806, the filter 708 is reset 0V by the generated flush or reset pulse. Rather, any capacitor implemented within filter 708 is discharged to 0V. At 808, the received SR_T pulse is delayed in order allow the generated flush or reset pulse to discharge the capacitor associated with the filter 708 prior to the combined charge pump device 706 and filter device 708 integrating the received SR_T pulse. At 810, once the filter device 708 is reset, the delayed SR_T pulse is integrated by the combined charge pump device 706 and filter device 708. The integrated SR_T pulse generates a corresponding DC voltage level defined as DC control voltage SR_V. The corresponding DC control voltage SR_V is held by the filter 708 capacitor until it is discharged by the next received pulse.

Figure 9A:
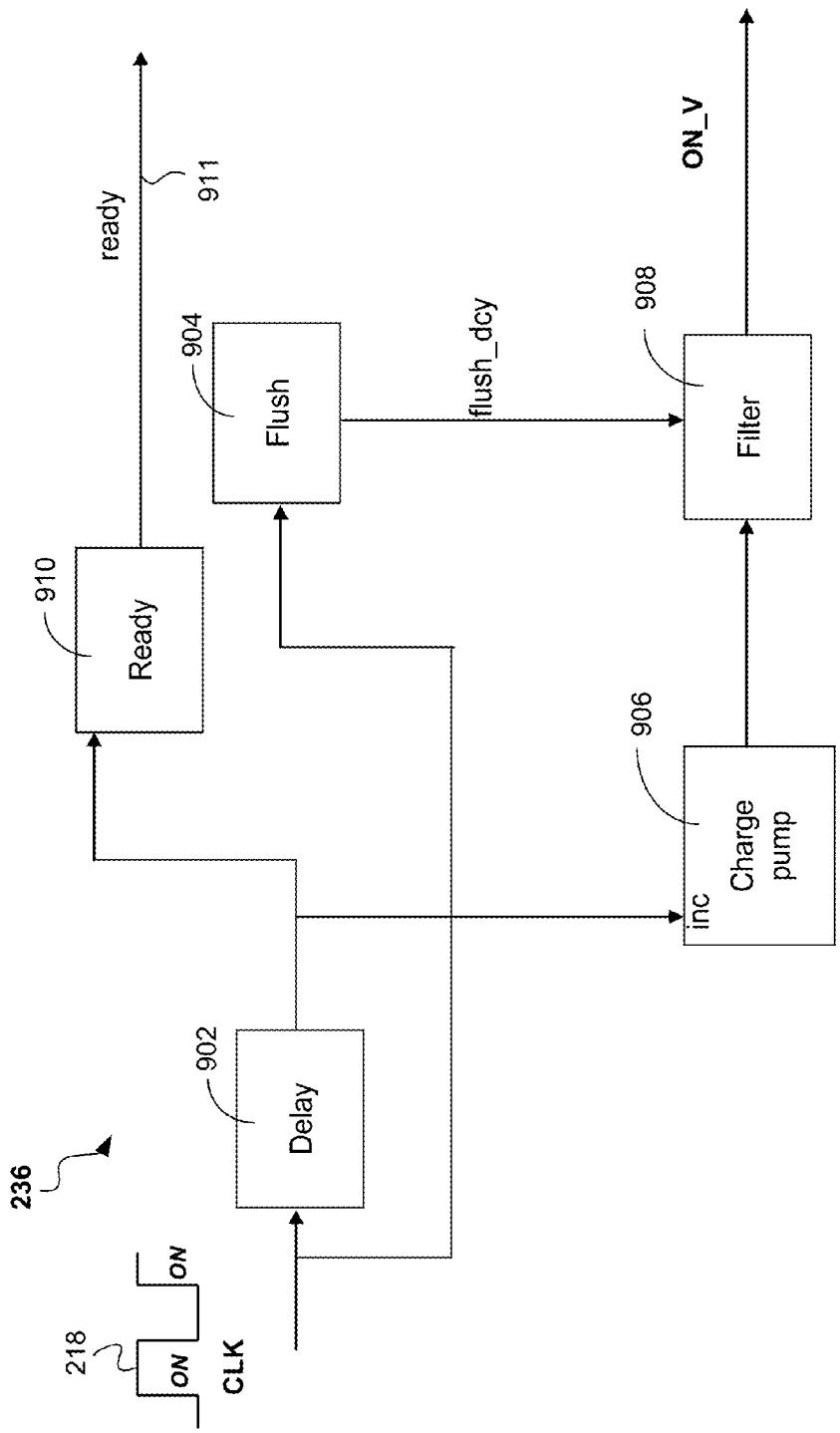
FIGS. 9A and 9B refer to an exemplary embodiment of a pulse duration measurement circuits shown in FIG. 2.
Figure 9B:
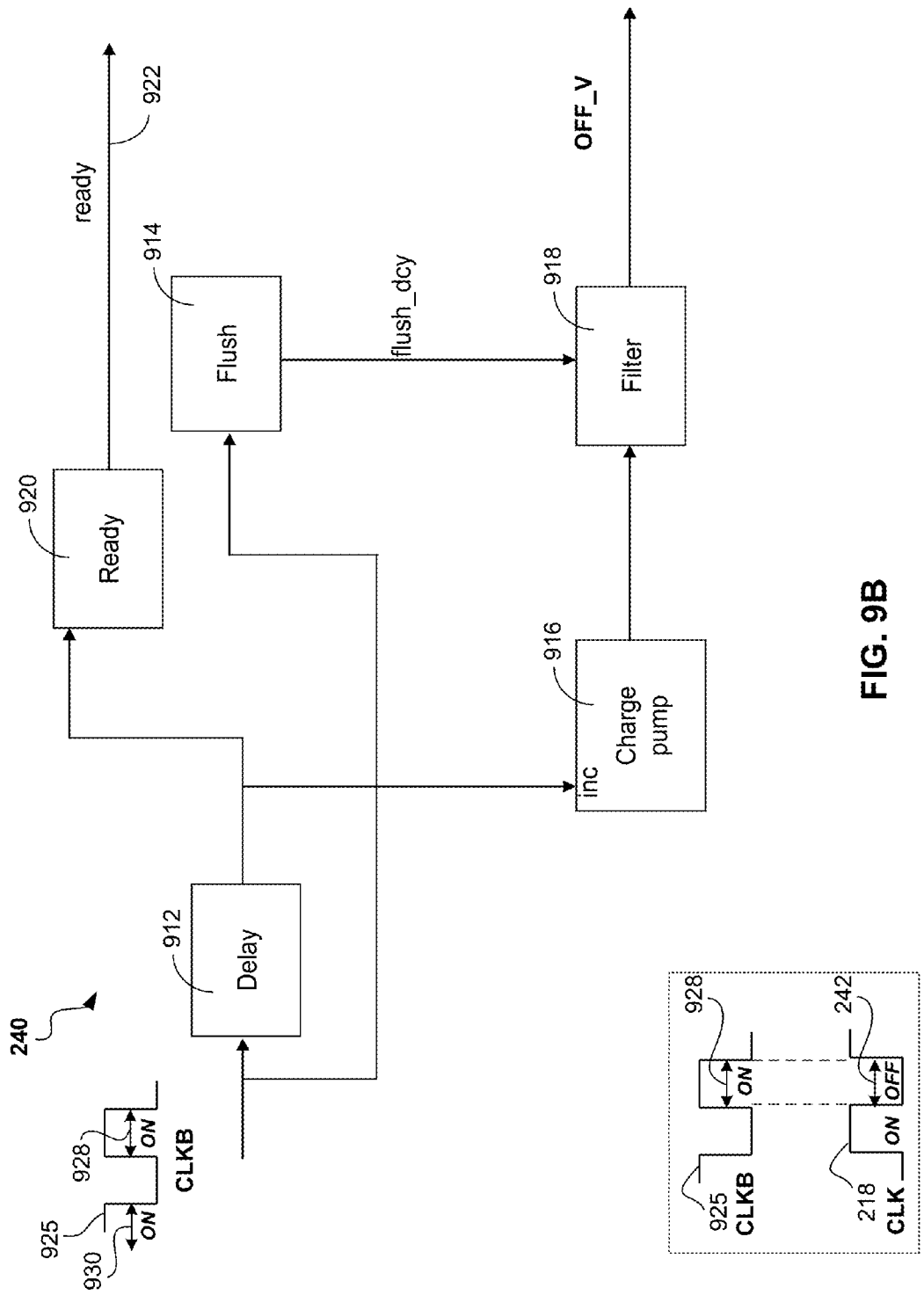

FIGS. 9A and 9B refer to one exemplary embodiment of the pulse duration measurement circuit 204 shown in FIG. 2. As previously described in relation to FIG. 2, the pulse duration measurement circuit 204 (FIG. 2) includes two identical first and second pulse measurement circuits 236, 240 (FIG. 2). FIG. 9A illustrates an exemplary embodiment of the first pulse measurement circuit 236 and FIG. 9B illustrates an identical exemplary embodiment of the second pulse measurement circuits 240.

FIG. 9A refers to one exemplary embodiment of the first pulse measurement circuit 236 shown in FIG. 2. The first pulse measurement circuit 236 may include a delay device 902, a flush generation device 904, a charge pump device 906, a filter device 908, and a ready control device 910. In operation, the first pulse measurement circuit 236 receives input clock signal 218 (FIG. 2) and generates DC control voltage ON_V based on measuring the ON-period 238 (FIG. 2) of the clock signal 218 (FIG. 2). The ON_V signal is a reference DC voltage that is generated based on the pulse width of the ON-period of the clock 218. Thus, the ON-period duration is used as a reference for maintaining a set optimal rise time for the slew-controlled output clock signal 226.

The charge pump device 906 and filter device 908 (e.g., a capacitor) operate as an integrator device. As such, any clock pulse signal (i.e., clock ON period) received by the charge pump device 906 and filter device 908 combination, is integrated to generate a signal that ramps up to a certain DC voltage level based on the width of the received clock pulse. Since the first pulse measurement circuit 236 generates a DC voltage (ON_V) for each pulse width of the clock 218 (FIG. 2) ON-period, the integration operation should be reset for each received pulse width. This reset operation is provided by the delay device 902 and the flush generation device 904. When a received pulse (i.e., clock ON period) is integrated, the filter device 908 may hold the generated DC voltage (ON_V) using a capacitor device (not shown). Prior to integrating the next received pulse (i.e., next clock ON period), however, the capacitor should be discharged in preparation for the next integration operation. Thus, any generated DC voltage (ON_V) held by the filter 908 is reset to zero volts by a pulse generated by the flush generation circuit 904. The flush generation circuit 904 is activated by the rising edge of each ON-period of the received clock signal 218. The delay device 902 ensures that the ON-period pulse that is received by the charge pump device 906 and filter device 908 is delayed by enough time duration in order to allow the filter 908 to be reset to 0V prior to integrating the ON-period pulse.

The ready control device 910 of the first pulse measurement circuit 236 provides a ready control signal at output 911 after the falling edge of the ON-period of the clock 218. This ready control signal indicates that the ON_V is ready to be received and processed by the slew-rate to pulse duration comparison circuit 206 (FIG. 2).

FIG. 9B refers to one exemplary embodiment of the second pulse measurement circuit 240 shown in FIG. 2. The second pulse measurement circuit 240 may include a delay device 912, a flush generation device 914, a charge pump device 916, a filter device 918, and a ready control device 920. In operation, the second pulse measurement circuit 240 receives an inverted replica (CLKB) of input clock signal 218, as defined by 925, and thus generates DC control voltage OFF_V based on the OFF-period 242 of the clock signal 218. The OFF_V signal is a reference DC voltage that is generated based on the width of the OFF-period 242 of the clock 218. Thus, the OFF-period duration is used as a reference for maintaining a set optimal fall time for the slew-controlled output clock signal 226. The circuit of FIG. 9B processes an inverted replica (CLKB) of the input clock signal 218, as defined by clock 925, because the inverted OFF-period 242 of clock signal 218 corresponds to an ON pulse 928 that can, therefore, be integrated.

The charge pump device 916 and filter device 918 (e.g., a capacitor) operate as an integrator device. As such, any clock pulse signal (e.g., ON pulse 928) received by the charge pump device 916 and filter device 918 combination, is integrated to generate a signal that ramps up to a certain DC voltage level based on the width of the received clock pulse. Since the second pulse measurement circuit 240 generates a DC voltage (OFF_V) for each ON pulse width of the clock 925, the integration operation should be reset for each received pulse. This reset operation is provided by the delay device 912 and the flush generation device 914. When a received pulse (e.g., ON pulse 928) is integrated, the filter device 918 may hold the generated DC voltage (OFF_V) using a capacitor device (not shown). Prior to integrating the next received pulse (e.g., next ON pulse 930), however, the capacitor should be discharged in preparation for the next integration operation. Thus, any generated DC voltage (OFF_V) held by the filter 918 is reset to zero volts by a pulse generated by the flush generation circuit 914. The flush generation circuit 914 is activated by the rising edge of each ON pulse of the received inverted clock signal 925 (CLKB). The delay device 912 ensures that the ON pulse 928 that is received by the charge pump device 916 and filter device 918 is delayed by enough time duration in order to allow the filter 918 to be reset to 0V prior to integrating the ON pulse 928.

The ready control device 920 of the second pulse measurement circuit 240 provides a ready control signal at output 922 after the falling edge of each ON pulse of inverted clock signal 925. This ready control signal indicates that the OFF_V is ready to be received and processed by the slew-rate to pulse duration comparison circuit 206 (FIG. 2).

The gain of the charge pump device 706 associated with slew-rate measurement circuit 210 (FIG. 7) is set to a higher value than the gain of charge pump devices 906 and 916 of pulse duration measurement circuits 236 and 240, respectively. Such a gain setting ensures that for each ON-period of the clocks (i.e., CLK and CLKB), the slew-controlled output clock signal 226 rise and fall times occur within the ON-period of both clocks (i.e., CLK and CLKB) and include an additional interval ($t_{safety}$) as a safety margin. The safety margin ($t_{safety}$) is an additional time interval between the slew-controlled output clock signal 226 achieving a full rail-to-rail swing (i.e., $V_{ground} \rightarrow V_{supply}$; or $V_{supply} \rightarrow V_{ground}$) and the end of the pulse period. In effect the safety margin ($t_{safety}$) guarantees a full rail-to-rail swing for minimum DCD, while preventing over-slewing which degrades DNL.

Typically, for the ON-period of the CLK signal, the slew-controlled output clock signal 226 is set to rise to the supply rail ($V_{supply}$) voltage at approximately 70% of the ON-period interval of the CLK signal, which leaves the remaining 30% as the safety margin. Similarly, for the ON-period of the CLKB signal, the slew-controlled output clock signal 226 is set to fall to ground ($V_{ground}$) at approximately 70% of the ON-period interval of the CLKB signal, which also leaves the remaining 30% as the safety margin. Based on these rise/fall time parameters, if the gain of charge pump devices 906 (FIG. 9A) and 916 (FIG. 9B) is set to one (G=1), the gain of the charge pump device 706 associated with the slew-rate measurement circuit 210 (FIG. 7) is set to G=1/0.7 (i.e., based on 70% value)=1.42.

Generally, for the ON-period of the CLK signal, optimized rise/fall times for minimizing DNL and DCD may be accomplished by setting the rise time of the slew-controlled output clock signal 226 to reach the supply rail ($V_{supply}$) voltage at approximately 60%-80% of the ON-period interval of the CLK signal, which leaves the remaining 20%-40% as the safety margin. Similarly, for the ON-period of the CLKB signal, the slew-controlled output clock signal 226 may be set to fall to ground ($V_{ground}$) at approximately 60%-80% of the ON-period interval of the CLKB signal, which, therefore, leaves the remaining 20%-40% as the safety margin. Based on these rise/fall time parameters, if the gain of charge pump devices 906 (FIG. 9A) and 916 (FIG. 9B) is set to one (G=1), the gain of the charge pump device 706 associated with the slew-rate measurement circuit 210 (FIG. 7) is set to G=1/0.6-0.8 (i.e., based on 60%-80% value)=1.25-1.66.

Figure 10:
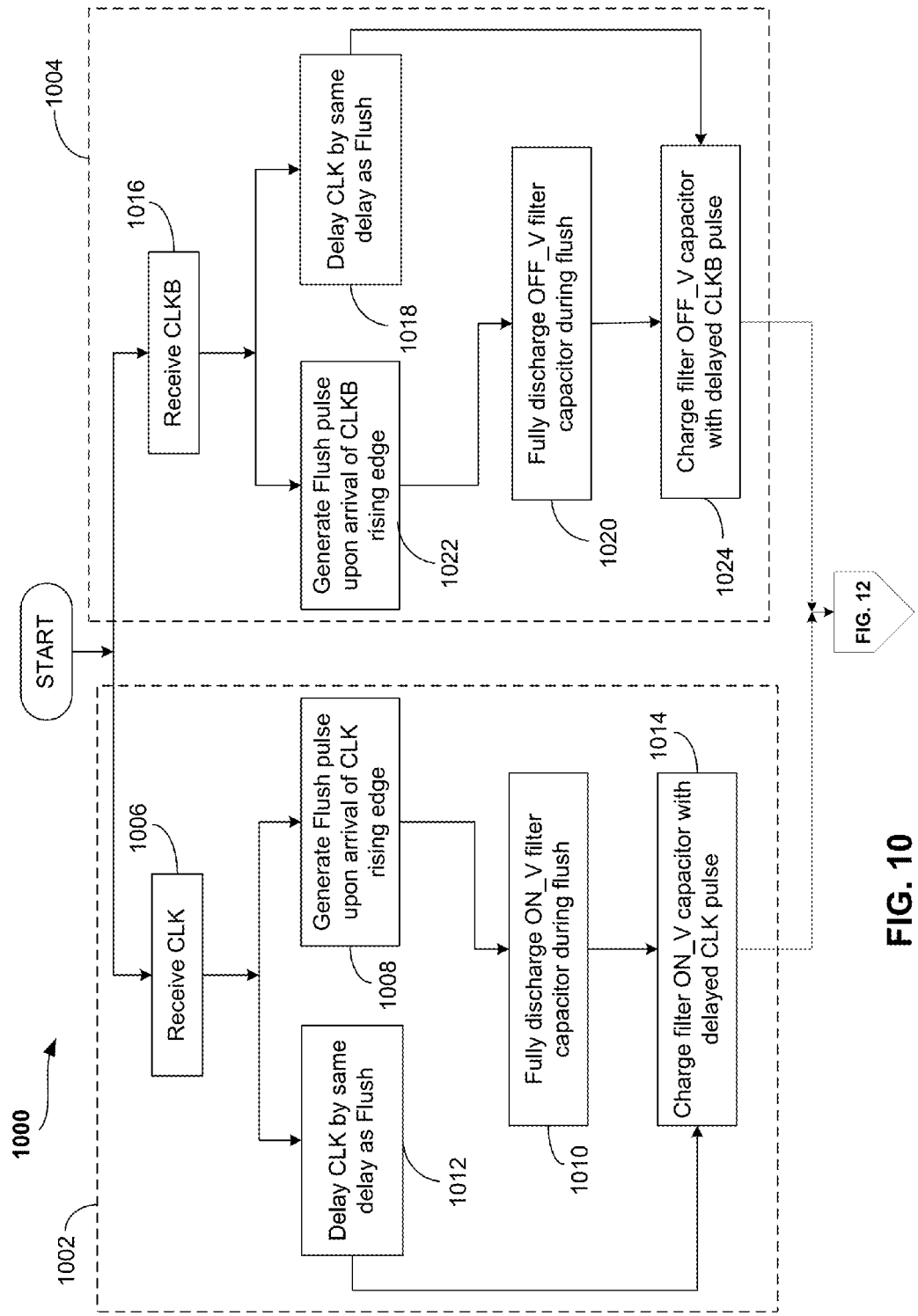
FIG. 10 illustrates an operational flow diagram for the pulse duration measurement circuits of FIGS. 9A and 9B.

FIG. 10 is an operational flow diagram 1000 for the first and second pulse measurement circuits 236, 240 shown in FIGS. 9A and 9B, respectively. The operation of the first and second pulse measurement circuits 236, 240 will be described with the aid of FIGS. 9A, 9B, and 10.

Referring to FIG. 10, flow path 1002 corresponds to the operation of the first pulse duration measurement circuits 236, while flow path 1004 corresponds to the operation of the second pulse duration measurement circuits 240. Referring to flow path 1002, at 1006, the first pulse duration measurement circuits 236 receives the input clock signal 218. At 1008, using the rising transition of the clock 218, the flush generation device 904 generates a flush or reset pulse. At 1010, the filter 908 is reset 0V by the generated flush or reset pulse. Rather, any capacitor implemented within or as filter 908 is discharged to 0V. At 1012, the received clock signal 218 is delayed in order allow the generated flush or reset pulse to discharge the capacitor associated with the filter 908 prior to the combined charge pump device 906 and filter device 908 integrating the received clock signal 218. At 1014, once the filter device 908 is reset (i.e., capacitor is discharged), the delayed clock signal 2180N-period pulse is integrated by the combined charge pump device 906 and filter device 908. The integrated clock signal 2180N-period pulse generates a corresponding DC voltage level defined as DC control voltage ON_V. The ON_V signal is held by the capacitor of the filter device 908 until the next reset operation.

Referring to flow path 1004, at 1016, the second pulse measurement circuits 240 receives the inverted input clock signal 925. At 1018, using the rising transition of the clock 925, the flush generation device 914 generates a flush or reset pulse. At 1020, the filter 918 is reset 0V by the generated flush or reset pulse. Rather, any capacitor implemented within or as filter 918 is discharged to 0V. At 1022, the received clock signal 925 is delayed in order allow the generated flush or reset pulse to discharge the capacitor associated with the filter 918 prior to the combined charge pump device 906 and filter device 908 integrating the received clock signal 925. At 1024, once the filter device 918 is reset (i.e., capacitor is discharged), the delayed clock signal 9250N-period pulse is integrated by the combined charge pump device 916 and filter device 918. The integrated clock signal 9250N-period pulse generates a corresponding DC voltage level defined as DC control voltage OFF_V. The OFF_V signal is held by the capacitor of the filter device 918 until the next reset operation.

Figure 11:
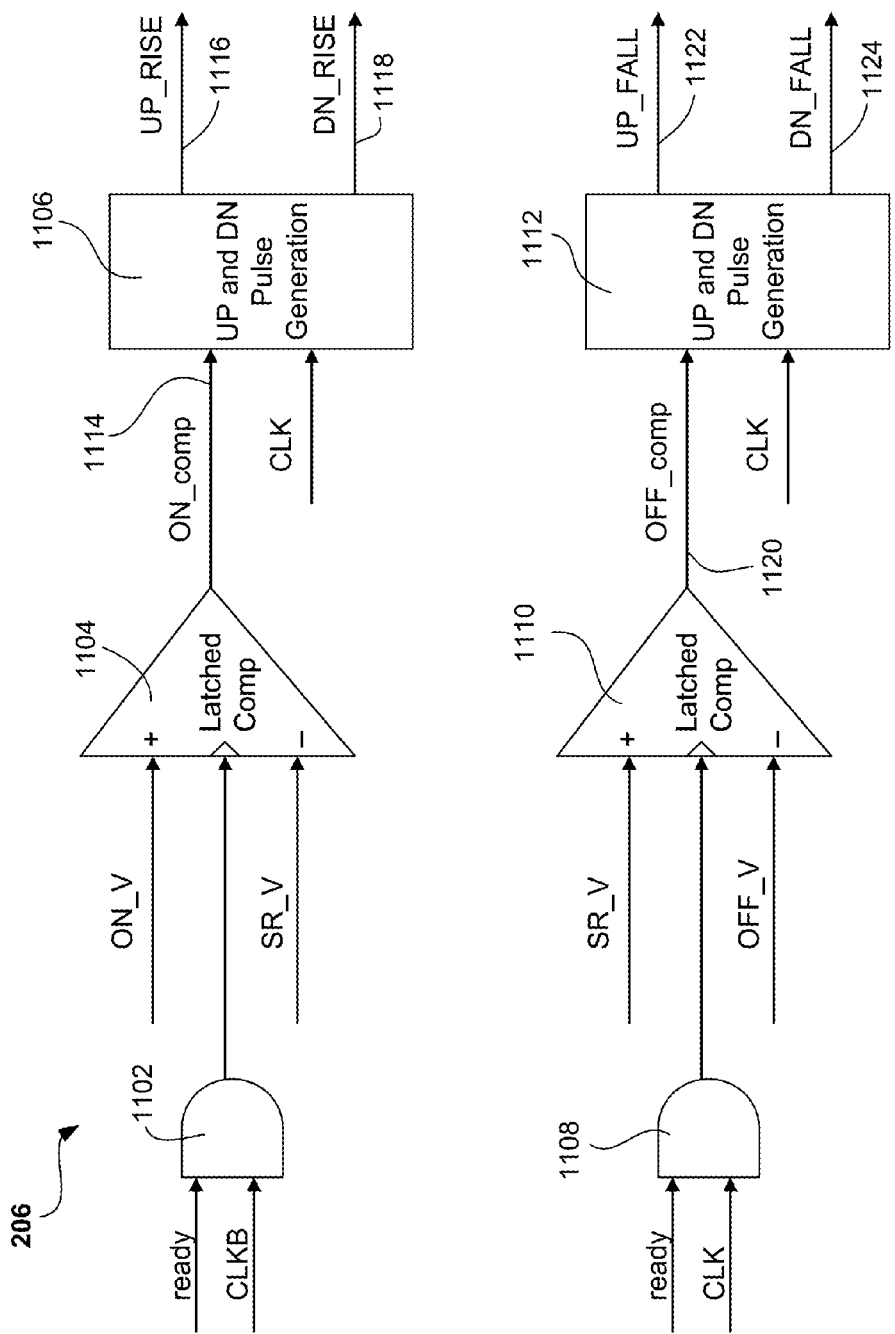
FIG. 11 refers to an exemplary embodiment of a slew to pulse duration comparison circuit shown in FIG. 2.

FIG. 11 refers to one exemplary embodiment of the slew to pulse duration comparison circuit 206 shown in FIG. 2. The slew to pulse duration comparison circuit 206 may include a first AND logic gate device 1102, a first latched comparator device 1104, a first pulse generation device 1106, a second AND logic gate device 1108, a second latched comparator device 1110, and a second pulse generation device 1112.

In operation, the first AND logic gate device 1102, the first latched comparator device 1104, and the first pulse generation device 1106 are collectively configured to compare the ON_V voltage representative of the ON-period duration of clock 218 with the SR_V voltage associated with the rise time of the slew-controlled output clock signal 226. Based on the result of this comparison, an UP_RISE or a DN_RISE pulse signal is generated, where the UP_RISE pulse is used to control a rise time increase (i.e., slower rise time) of the slew-controlled output clock signal 226 and the DN_RISE pulse is used to control a rise time decrease (i.e., faster rise time) of the slew-controlled output clock signal 226.

Similarly, in operation, the second AND logic gate device 1108, the second latched comparator device 1110, and the second pulse generation device 1112 are collectively configured to compare the OFF_V voltage representative of the OFF-period duration of clock 218 with the SR_V voltage associated with the fall time of the slew-controlled output clock signal 226. Based on the result of this comparison, an UP_FALL or a DN_FALL pulse signal is generated, where the DN_FALL pulse is used to control a fall time increase (i.e., slower fall time) of the slew-controlled output clock signal 226 and the UP_FALL pulse is used to control a fall time decrease (i.e., faster fall time) of the slew-controlled output clock signal 226.

Figure 12:
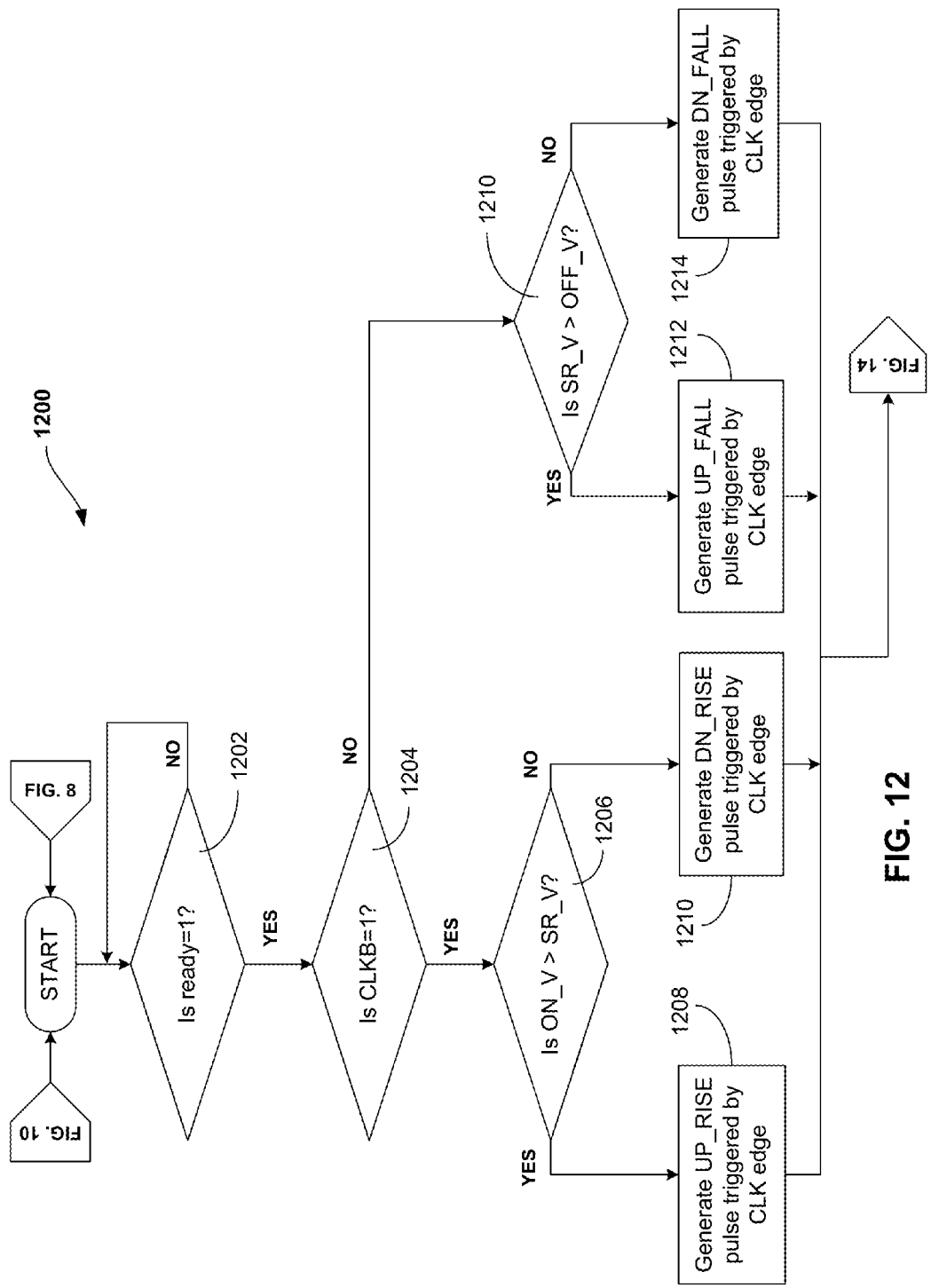
FIG. 12 illustrates an operational flow diagram for the slew to pulse duration comparison circuit of FIG. 11.

FIG. 12 is an operational flow diagram 1200 for the slew to pulse duration comparison circuit 206 shown in FIG. 11. The operation of the slew-rate to pulse duration comparison circuit 206 will be described with the aid of FIGS. 11 and 12. Referring to FIG. 12, at 1202 it is determined whether a ready control pulse signal from either ready control device 910 or 920 is generated. A generated ready control pulse signal signifies that either an ON_V or OFF_V value has been determined for processing. When a ready control pulse signal is generated, a logic '1' is received by AND logic gates 1102 and 1108.

At 1204, it is further determined whether the inverted clock signal (CLKB) is within its ON-period (see FIG. 9B). At 1206, if the inverted clock signal (CLKB) is within its ON-period and the ready control signal generates a logic '1' during its pulse period, at 1206, the first latched comparator 1104 clocks the comparison between the generated ON_V (FIG. 9A) and SR_V (FIG. 7) voltages to comparator output 1114. The first latched comparator 1104 determines whether the ON_V voltage is greater than the SR_V voltage.

At 1208, if is determined that the ON_V has a greater voltage than SR_V, an UP_RISE pulse is generated at output 1116 of the first pulse generation device 1106. As previously described, the UP_RISE pulse is associated with providing an incremental increase in the rise time of the slew-controlled output clock signal 226. At 1210, if is determined that the ON_V has a lesser voltage than SR_V, a DN_RISE pulse is generated at output 1118 of the first pulse generation device 1106. As previously described, the DN_RISE pulse is associated with providing an incremental decrease in the rise time of the slew-controlled output clock signal 226.

At 1204, if it is determined that inverted clock signal (CLKB) is not within its ON-period (see FIG. 9B), then the clock (CLK) signal is within its ON-period (see FIG. 9A). At 1204, if the clock signal (CLK) is within the ON-period and the ready control signal generates a logic '1' during its pulse period, at 1210, the second latched comparator 1110 clocks the comparison between the generated OFF_V (FIG. 9A) and SR_V (FIG. 7) voltages to comparator output 1120. The second latched comparator 1110 determines whether the SR_V voltage is greater than the OFF_V voltage.

At 1212, if it is determined that the SR_V has a greater voltage than OFF_V, an UP_FALL pulse is generated at output 1122 of the second pulse generation device 1110. As previously described, the UP_FALL pulse is associated with providing an incremental decrease in the fall time of the slew-controlled output clock signal 226. At 1214, if is determined that the SR_V has a lesser voltage than OFF_V, a DN_FALL pulse is generated at output 1124 of the second pulse generation device 1110. As previously described, the DN_FALL pulse is associated with providing an incremental increase in the fall time of the slew-controlled output clock signal 226.

Figure 13:
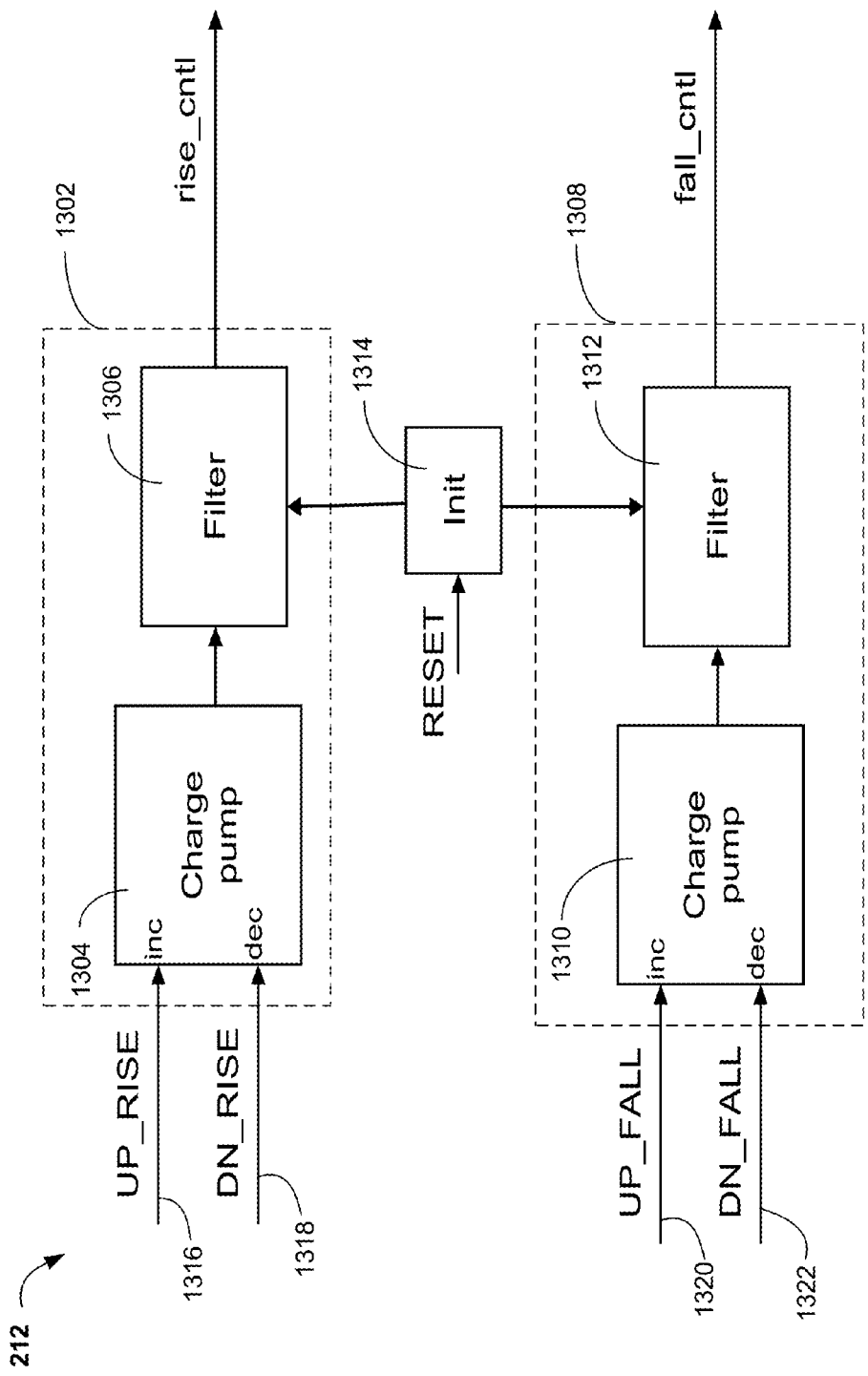
FIG. 13 refers to an exemplary embodiment of the slew-rate adjustment control circuit shown in FIG. 2.

FIG. 13 refers to one exemplary embodiment of the slew-rate adjustment control circuit 212 shown in FIG. 2. The slew-rate adjustment control circuit 212 may include a first integrator 1302 having a first charge pump device 1304 and a first filter device 1306 (e.g., a capacitor device). The slew-rate adjustment control circuit 212 may also include a second integrator 1308 having a second charge pump device 1310 and a second filter device 1312 (e.g., a capacitor device). An initialization device 1314 is also included in order to initially set the filter voltage values and override the rise_cntl and fall_cntl values used to drive the control circuits 202, 222 (FIG. 2). The override rise_cntl and fall_cntl values can be configured to initially generate a valid rail-rail transition times, for example fast rise and fall time that enables rail-to-rail transitions for the slew-controlled output clock signal 226. Once the override values are set, the feedback operation locks in and re-adjusts and maintains an optimized rise and fall time for the clock signals on inputs 220 (FIG. 2) and 230 (FIG. 2). As illustrated, the first integrator 1302 controls the rise time of the slew-controlled output clock signal 226, while the second integrator 1308 controls the fall time of the slew-controlled output clock signal 226.

Figure 14:
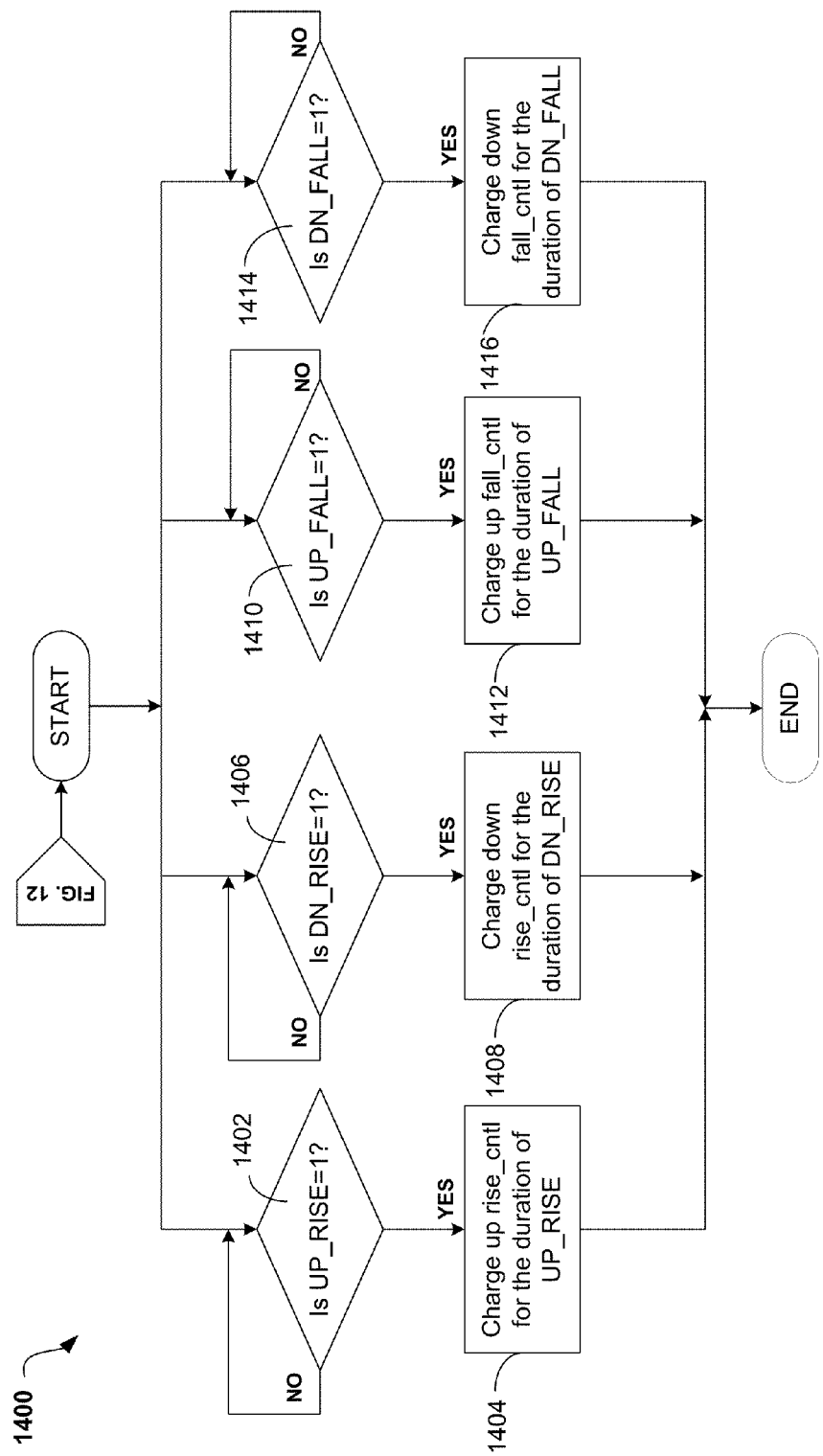
FIG. 14 illustrates an operational flow diagram for the slew-rate adjustment control circuit of FIG. 13.

FIG. 14 is an operational flow diagram 1400 for the slew-rate adjustment control circuit 212 shown in FIG. 13. The operation of the slew-rate adjustment control circuit 212 will be described with the aid of FIGS. 13 and 14. Referring to FIG. 14, at 1402, it is determined whether an UP_RISE pulse is received on input 1316 of the charge pump device 1304. If so, at 1404, the charge pump 1304 generates an incremental increase in DC voltage that is stored by the filter device 1306 (e.g., a storage capacitor) to provide a rise_cntl signal in the form of an incremented DC adjustment voltage. The incremented DC adjustment voltage is then applied to input 402 (FIG. 4) of the slew control buffer circuit 202 (FIG. 4), whereby the increased voltage provides less current flow through pFET 406 (FIG. 4) and, thus, increases the rise time (i.e., a slower rising transition) of the slew-controlled output clock signal 226.

At 1406, it is determined whether a DN_RISE pulse is received on input 1318 of the charge pump device 1304. If so, at 1408, the charge pump 1304 generates a decremented DC voltage that is drained from the filter device 1306 (e.g., a storage capacitor) to provide a rise_cntl signal in the form of a decreased DC adjustment voltage. The decreased DC adjustment voltage is also applied to input 402 (FIG. 4) of the slew control buffer circuit 202 (FIG. 4), whereby the decreased voltage provides more current flow through pFET 406 (FIG. 4) and, thus, decreases the rise time (i.e., a faster rising transition) of the slew-controlled output clock signal 226.

At 1410, it is determined whether an UP_FALL pulse is received on input 1320 of the charge pump device 1310. If so, at 1412, the charge pump 1310 generates an incremented DC voltage that is stored by the filter device 1306 (e.g., a storage capacitor) to provide a fall_cntl signal in the form of an increased DC adjustment voltage. The increased DC adjustment voltage is applied to input 404 (FIG. 4) of the slew control buffer circuit 202 (FIG. 4), whereby the increased voltage provides more current flow through nFET 408 (FIG. 4) and, thus, decreases the fall time (i.e., a faster falling transition) of the slew-controlled output clock signal 226.

At 1414, it is determined whether a DN_FALL pulse is received on input 1322 of the charge pump device 1310. If so, at 1416, the charge pump 1310 generates a decremented DC voltage that is drained from the filter device 1306 (e.g., a storage capacitor) to provide a fall_cntl signal in the form of a decreased DC adjustment voltage. The decreased DC adjustment voltage is applied to input 404 (FIG. 4) of the slew control buffer circuit 202 (FIG. 4), whereby the decreased voltage provides less current flow through nFET 408 (FIG. 4) and, thus, increases the fall time (i.e., a slower falling transition) of the slew-controlled output clock signal 226.

Figure 15:
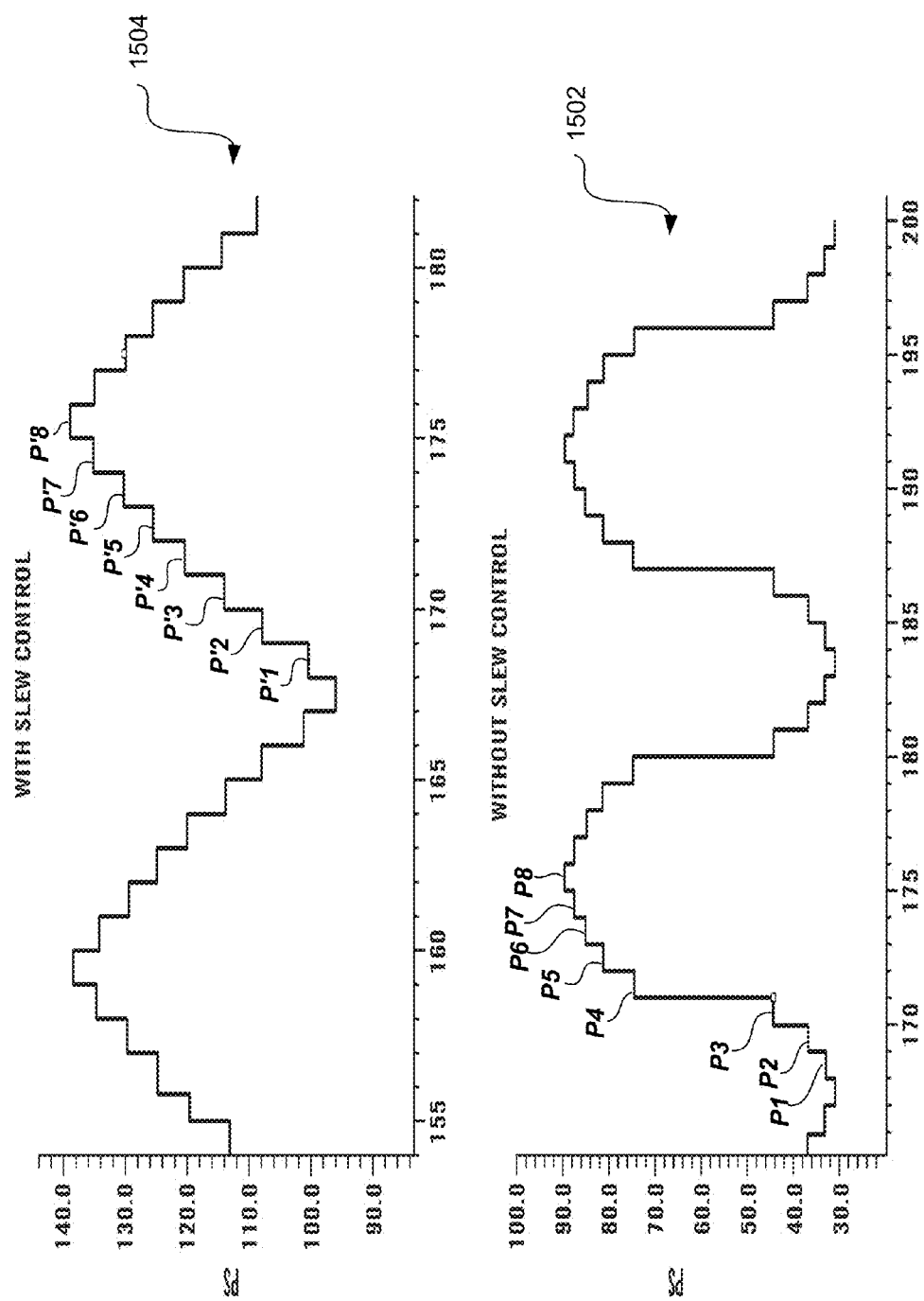
FIG. 15 shows simulated phase step measurements for an interpolator output not using slew-rate control verses measurements for an interpolator using the slew-rate control embodiment of the present invention.

FIG. 15 shows simulated phase step measurements for an interpolator output not using slew-rate control 1502 verses simulated phase step measurements for an interpolator using the slew-rate control mechanism embodiments of the present invention 1504. As illustrated, for the simulated measurements 1502 conducted without any slew-rate control, there is a significant non-linearity (i.e., wide DNL) associated with the interpolator generated phase steps, as defined by P1-P8. More specifically, there is a relatively large phase delay step between phase step P3 and phase step P4. In contrast, the simulated measurements 1504 obtained for a slew-rate controlled interpolator output show significantly linear phase delay steps exhibiting little to no DNL, as defined by P'1-P'8.

For example, if the on-period 238 (FIG. 2) of the clock 218 (FIG. 2) increases, the slew-rate or rise/fall transition times of the slew-controlled output clock signal 226 is also accordingly adjusted to compensate for this increase in on-period 238. Thus, an increase in the on-period 238 (FIG. 2) will cause the ON_V control signal to exhibit a DC voltage increase. At the slew to pulse duration comparison circuit 206 (FIG. 11), the ON_V value is determined to be greater than SR_V by the first latched comparator 1104 (FIG. 11). As such, the first pulse generation circuit 1106 generates an UP_RISE pulse at output 1116 (FIG. 11). The slew-rate adjustment control circuit 212 (FIG. 13) receives the generated UP_RISE pulse and provides an incremental DC voltage increase via the rise_cntl signal. The slew control buffer circuit 202 (FIG. 4) receives the incremental DC voltage increase associated with the rise_cntl signal at input 402. As the incremental increase in DC voltage reduces current flow through the pFET device 406, the rise time of the slew-controlled output clock signal 226 is accordingly increased (i.e., slower transition). Therefore, although the on-period 238 (FIG. 2) of the clock 218 (FIG. 2) increases, the rise time of the slew-controlled output clock signal 226 is accordingly increased to track and maintain the same rise time duration within the on-period 238 (FIG. 2).

For example, if the on-period 238 (FIG. 2) of the clock 218 (FIG. 2) decreases, the slew-rate or rise/fall transition times of the slew-controlled output clock signal 226 is also accordingly adjusted to compensate for this decrease in on-period 238. Thus, a decrease in the on-period 238 (FIG. 2) will cause the ON_V control signal to exhibit a DC voltage decrease. At the slew to pulse duration comparison circuit 206 (FIG. 11), the ON_V value is determined to be less than SR_V by the first latched comparator 1104 (FIG. 11). As such, the first pulse generation circuit 1106 generates a DN_RISE pulse at output 1118 (FIG. 11). The slew-rate adjustment control circuit 212 (FIG. 13) receives the generated DN_RISE pulse and provides an incremental DC voltage decrease via the rise_cntl signal. The slew control buffer circuit 202 (FIG. 4) receives the incremental DC voltage decrease associated with the rise_cntl signal at input 402. As the incremental decrease in DC voltage increases current flow through the pFET device 406, the rise time of the slew-controlled output clock signal 226 is accordingly decreased (i.e., faster transition). Therefore, although the on-period 238 (FIG. 2) of the clock 218 (FIG. 2) decreases, the rise time of the slew-controlled output clock signal 226 is accordingly decreased to maintain the same rise time duration within the on-period 238 (FIG. 2).

For example, if the off-period 242 (FIG. 2) of the clock 218 (FIG. 2) increases, the slew-rate or rise/fall transition times of the slew-controlled output clock signal 226 is also accordingly adjusted to compensate for this increase in off-period 242. Thus, an increase in the off-period 242 (FIG. 2) will cause the OFF_V control signal to exhibit a DC voltage increase. At the slew to pulse duration comparison circuit 206 (FIG. 11), the OFF_V value is determined to be greater than SR_V by the second latched comparator 1110 (FIG. 11). As such, the second pulse generation circuit 1112 generates a DN_FALL pulse at output 1124 (FIG. 11). The slew-rate adjustment control circuit 212 (FIG. 13) receives the generated DN_FALL pulse and provides an incremental DC voltage decrease via the fall_cntl signal. The slew control buffer circuit 202 (FIG. 4) receives the incremental DC voltage decrease associated with the fall_cntl signal at input 404. As the incremental decrease in DC voltage reduces current flow through the nFET device 408, the fall time of the slew-controlled output clock signal 226 is accordingly increased (i.e., slower transition). Therefore, although the off-period 242 (FIG. 2) of the clock 218 (FIG. 2) increases, the fall time of the slew-controlled output clock signal 226 is accordingly increased to maintain the same fall time duration within the off-period 238 (FIG. 2).

For example, if the off-period 242 (FIG. 2) of the clock 218 (FIG. 2) decreases, the slew-rate or rise/fall transition times of the slew-controlled output clock signal 226 is also accordingly adjusted to compensate for this decrease in off-period 242. Thus, a decrease in the off-period 242 (FIG. 2) will cause the OFF_V control signal to exhibit a DC voltage decrease. At the slew to pulse duration comparison circuit 206 (FIG. 11), the OFF_V value is determined to be less than SR_V by the second latched comparator 1110 (FIG. 11). As such, the second pulse generation circuit 1112 generates a UP_FALL pulse at output 1122 (FIG. 11). The slew-rate adjustment control circuit 212 (FIG. 13) receives the generated UP_FALL pulse and provides an incremental DC voltage increase via the fall_cntl signal. The slew control buffer circuit 202 (FIG. 4) receives the incremental DC voltage increase associated with the fall_cntl signal at input 404. As the incremental increase in DC voltage increases current flow through the nFET device 408, the fall time of the slew-controlled output clock signal 226 is accordingly decreased (i.e., faster transition). Therefore, although the off-period 242 (FIG. 2) of the clock 218 (FIG. 2) reduces, the fall time of the slew-controlled output clock signal 226 is accordingly decreased to maintain the same fall time duration within the off-period 238 (FIG. 2).

As described above, the rise and fall transition times of the slew-controlled output clock signal 226 are independently controlled over each cycle (i.e., on-period and off-period) of the input clock signal. Any changes in frequency and/or mark-to-space ratio of the input clock are compensated by accordingly controlling the rise and fall transition times of the slew-controlled output clock signal 226.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A slew-rate control circuit for controlling slew rate of a clock signal that is input to a phase interpolator and generating a slew-rate controlled clock signal, the slew rate control circuit comprising:
    a first pulse measurement circuit operable to receive the clock signal and generate both a first reference voltage from a first clock pulse duration associated with an on-period of the received clock signal and a second reference voltage from a second clock pulse duration associated with an off-period of the received clock signal;
    a second pulse measurement circuit operable to generate a first voltage from a first pulse duration associated with a rise time of the generated slew-rate controlled clock signal and a second voltage from a second pulse duration associated with a fall time of the generated slew-rate controlled clock signal; and
    an adjustment circuit operable to generate a first adjustment voltage and a second adjustment voltage, the first adjustment voltage operable to control the rise time of the generated slew-rate controlled clock signal based on comparing the generated first reference voltage and the generated first voltage, and the second adjustment voltage operable to control the fall time of the generated slew-rate controlled clock signal based on comparing the generated second reference voltage and the generated second voltage.

2. The circuit of claim 1, further comprising:
    a control circuit operable to receive the clock signal and generate the slew-rate controlled clock signal based on receiving the generated first adjustment voltage and the generated second adjustment voltage,
    wherein, for each cycle of the clock signal, an updated slew rate for the slew-rate controlled clock signal is generated based on the on-period and the off-period of the received clock signal.

3. The circuit of claim 2, further comprising:
    an other control circuit operable to receive an other clock signal and generate an other slew-rate controlled clock signal based on the generated first adjustment voltage and the generated second adjustment voltage,
    wherein, for each cycle of the clock signal, an updated slew rate for the other slew-rate controlled clock signal is generated based on the on-period and the off-period of the received clock signal.

4. The circuit of claim 3, wherein the control circuit and the other control circuit each comprise a current-starved inverter circuit.

5. The circuit of claim 1, wherein the second pulse measurement circuit comprises:
    a detection circuit operable to receive the slew-rate controlled clock signal and generate a first pulse having the first pulse duration associated with the rise time of the generated slew-rate controlled clock signal and a second pulse having the second pulse duration associated with the fall time of the generated slew-rate controlled clock signal; and
    a slew-rate pulse measurement circuit operable to receive the first pulse and generate the first adjustment voltage and receive the second pulse and generate the second adjustment voltage.

6. The circuit of claim 5, wherein the slew-rate pulse measurement circuit comprises an integrator circuit operable to integrate the first pulse and generate the first adjustment voltage, and integrate the second pulse and generate the second adjustment voltage.

7. The circuit of claim 1, wherein the first pulse measurement circuit comprises:
    a first measurement circuit operable receive the clock signal and generate the first reference voltage from the first clock pulse duration associated with the on-period of the received clock signal; and
    a second measurement circuit operable to receive an inverted replica of the clock signal and generate the second voltage from the second pulse duration associated with the off-period of the received clock signal.

8. The circuit of claim 7, wherein:
    the first measurement circuit comprises a first integrator circuit operable to integrate the on-period of the received clock signal and generate the first reference voltage; and
    the second measurement circuit comprises a second integrator circuit operable to integrate an on-period of the inverted replica of the clock signal and generate the second reference voltage, wherein the on-period of the inverted replica of the clock signal corresponds to the off-period of the clock signal.

9. The circuit of claim 1, wherein the adjustment circuit comprises:
    a comparison circuit operable to generate rise-time control voltages based on comparing the generated first reference voltage with the generated first voltage, and generating fall-time control voltages based on comparing the generated second reference voltage with the generated second voltage; and a slew adjustment circuit operable to receive the generated rise-time control voltages and generate the first adjustment voltage and receive the generated fall-time control voltages and generate the second adjustment voltage.

10. The circuit of claim 9, wherein the generated rise-time control voltages comprise:

a first pulse signal operable to generate an increase in the first adjustment voltage; and a second pulse signal operable to generate a decrease in the first adjustment voltage.

11. The circuit of claim 9, wherein the generated fall-time control voltages comprise:

a first pulse signal operable to generate a decrease in the second adjustment voltage; and a second pulse signal operable to generate an increase in the first adjustment voltage.

12. A method of controlling slew-rate of a clock signal that is input to a slew-rate control circuit of a phase interpolator for generating a slew-rate controlled clock signal, the method comprising:

generating a first voltage from a rise time of the slew-rate controlled clock signal generated by the slew-rate control circuit;

generating a second voltage from a fall time of the generated slew-rate controlled clock signal generated by the slew-rate control circuit;

generating a first reference voltage from a first pulse duration associated with an on-period of the clock signal received by the slew-rate control circuit;

generating a second reference voltage from a second pulse duration associated with an off-period of the clock signal received by the slew-rate control circuit;

comparing the generated first reference voltage with the generated first voltage;

generating a first adjustment voltage based on the comparing of the first reference voltage with the generated first voltage, wherein the first adjustment voltage controls the rise time of the generated slew-rate controlled clock signal;

comparing the generated second reference voltage with the generated second voltage;

generating a second adjustment voltage based on the comparing of the second reference voltage with the generated second voltage, wherein the second adjustment voltage controls the fall time of the generated slew-rate controlled clock signal, wherein the first and the second reference voltage are generated by the slew-rate control circuit on each cycle of the clock signal.

13. The method of claim 12, wherein the generating the first voltage is generated by integrating a first pulse having an interval corresponding to the rise time of the generated slew-rate controlled clock signal.

14. The method of claim 13, wherein the generating the second voltage is generated by integrating a second pulse having an interval corresponding to the fall time of the generated slew-rate controlled clock signal.

15. The method of claim 14, wherein the generating the first reference voltage is generated by integrating the first pulse duration associated with the on-period of the clock signal.

16. The method of claim 15, wherein the generating the second reference voltage is generated by integrating a second pulse duration associated with an on-period of an inverted replica of the clock signal, the second pulse duration associated with the on-period of the inverted replica of the clock signal corresponding to the second pulse duration associated with the on-period of the clock signal.

17. The method of claim 13, further comprising:

controlling rise and fall times of a second clock signal using the first and the second adjustment values to provide a second slew-rate controlled clock signal for input to the phase interpolator.

18. The method of claim 13, wherein the rise time of the slew-rate controlled clock signal is about between 60%-80% of the first pulse duration associated with the on-period of the clock signal.

19. The method of claim 18, wherein the fall time of the slew-rate controlled clock signal is about between 60%-80% of the second pulse duration associated with the off-period of the clock signal.

20. The method of claim 13, wherein the first and the second voltage are amplified by gain of 1/0.8 to 1/0.6 compared to the first and the second reference voltage.

* * * * *